US011946680B2

(12) United States Patent
Tillemann-Dick et al.

(10) Patent No.: US 11,946,680 B2
(45) Date of Patent: Apr. 2, 2024

(54) INTEGRATED DILUTION REFRIGERATORS

(71) Applicant: Maybell Quantum Industries, Inc., Denver, CO (US)

(72) Inventors: Corban I. Tillemann-Dick, Denver, CO (US); Kyle J. Thompson, Boulder, CO (US); Bryan J. Choo, New York, NY (US); Johanna Zultak, Boulder, CO (US); Tyler James Plant, Thornton, CO (US)

(73) Assignee: Maybell Quantum Industries, Inc., Denver, CO (US)

( * ) Notice: Subject to any disclaimer, the term of this patent is extended or adjusted under 35 U.S.C. 154(b) by 0 days.

(21) Appl. No.: 17/860,909

(22) Filed: Jul. 8, 2022

(65) Prior Publication Data

US 2023/0012324 A1    Jan. 12, 2023

Related U.S. Application Data

(60) Provisional application No. 63/319,248, filed on Mar. 11, 2022, provisional application No. 63/219,795, filed on Jul. 8, 2021.

(51) Int. Cl.
*H05K 7/20* (2006.01)
*F25B 9/10* (2006.01)
(Continued)

(52) U.S. Cl.
CPC ............... *F25B 9/12* (2013.01); *F25B 9/10* (2013.01); *F25B 9/145* (2013.01); *F25B 25/005* (2013.01);
(Continued)

(58) Field of Classification Search
CPC ........ F25B 9/12; F25B 2500/13; F25B 9/145; F25B 9/10; F25B 9/14; F28F 3/14; H05K 7/20636; H05K 7/20772
See application file for complete search history.

(56) References Cited

U.S. PATENT DOCUMENTS 4,296,609 A     10/1981  Severijns et al.
4,672,823 A *   6/1987  Benoit ..................... F17C 3/085
                                                        62/50.1
(Continued)

FOREIGN PATENT DOCUMENTS

CN    111089436 A  *  5/2020
FR    2184536 A1   *  12/1973
(Continued)

OTHER PUBLICATIONS

Translation WO-2015004904-A1 (Year: 2015).*
(Continued)

*Primary Examiner* — David J Teitelbaum
(74) *Attorney, Agent, or Firm* — Wolf, Greenfield & Sacks, P.C.

(57) ABSTRACT

A dilution refrigerator is provided. The dilution refrigerator includes a plurality of thermalization plates configured to be cooled to a plurality of temperatures, and a first thermalization plate of the plurality of thermalization plates includes an integrated heat exchanger. The integrated heat exchanger includes channels formed in the first thermalization plate, and the channels are configured to allow helium to flow through the first thermalization plate during operation of the dilution refrigerator to improve heat exchange and cooling power of the dilution refrigerator.

21 Claims, 23 Drawing Sheets

(51) Int. Cl.
*F25B 9/12* (2006.01)
*F25B 9/14* (2006.01)
*F25B 25/00* (2006.01)
*F25D 19/00* (2006.01)
*B33Y 80/00* (2015.01)

(52) U.S. Cl.
CPC ........... *F25D 19/006* (2013.01); *H05K 7/208* (2013.01); *B33Y 80/00* (2014.12); *F25B 2500/13* (2013.01); *H05K 7/20827* (2013.01)

(56) References Cited

U.S. PATENT DOCUMENTS

| | | | |
|---|---|---|---|
| 4,986,077 A * | 1/1991 | Saho | F25D 19/006 62/51.1 |
| 5,172,554 A | 12/1992 | Swift et al. | |
| 5,207,674 A | 5/1993 | Hamilton | |
| 2004/0223300 A1 | 11/2004 | Fink et al. | |
| 2005/0223714 A1 | 10/2005 | Li et al. | |
| 2009/0275476 A1 | 11/2009 | Atrey | |
| 2015/0160702 A1 * | 6/2015 | Franz | G06F 1/20 361/679.47 |
| 2015/0196221 A1 | 7/2015 | Garside | |
| 2018/0045471 A1 | 2/2018 | Dietrich | |
| 2018/0051937 A1 | 2/2018 | Thiers et al. | |
| 2019/0226724 A1 * | 7/2019 | Kotsubo | F25B 9/145 |
| 2020/0370792 A1 | 11/2020 | Matthews | |
| 2021/0076530 A1 | 3/2021 | Hart et al. | |
| 2021/0402407 A1 * | 12/2021 | Hoehne | F25B 9/10 |
| 2022/0221108 A1 * | 7/2022 | Corcoles-Gonzalez | F25B 9/12 |
| 2023/0008279 A1 | 1/2023 | Tillemann-Dick et al. | |
| 2023/0009670 A1 | 1/2023 | Tillemann-Dick et al. | |
| 2023/0010758 A1 | 1/2023 | Tillemann-Dick et al. | |
| 2023/0010920 A1 | 1/2023 | Tillemann-Dick et al. | |
| 2023/0012324 A1 | 1/2023 | Tillemann-Dick et al. | |

FOREIGN PATENT DOCUMENTS

| | | | |
|---|---|---|---|
| GB | 2 282 437 A | 4/1995 | |
| JP | 2012-182176 A | 9/2012 | |
| WO | WO-2015004904 A1 * | 1/2015 | ......... B60H 1/00899 |

OTHER PUBLICATIONS

Translation FR-2184536-A1 (Year: 1973).*
Translation CN-111089436-A (Year: 2020).*
International Search Report and Written Opinion dated Nov. 23, 202, in connection with International Application No. PCT/US2022/036531.
Invitation to Pay Additional Fees dated Sep. 16, 2022, in connection with Application No. PCT/US2022/036531.
Pobell, Matter and Methods at Low Temperatures. Springer Berlin. Feb. 15, 2007:468 pages.
Smith et al., Flexible Coaxial Ribbon Cable for High-Density Superconducting Microwave Device Arrays. arXiv. Jul. 13, 2020:6 pages.
U.S. Appl. No. 18/182,244, filed Mar. 10, 2023, Tillemann-Dick et al.

* cited by examiner

INTEGRATED DILUTION REFRIGERATORS

CROSS-REFERENCE TO RELATED APPLICATIONS

This application claims the benefit under 35 U.S.C. § 119(e) of U.S. Provisional Patent Application No. 63/319,248 filed on Mar. 11, 2022, and titled "INTEGRATED DILUTION REFRIGERATORS," and of U.S. Provisional Patent Application No. 63/219,795 filed on Jul. 8, 2021, and titled "INTEGRATED DILUTION REFRIGERATORS," the contents of each of which are incorporated by reference herein in their entirety.

BACKGROUND

Dilution refrigerators are cryogenic devices that rely on the heat of mixing of the $^3$He and $^4$He isotopes to provide cooling down to temperatures between approximately 2 mK and 1 K. Classic dilution refrigerators, or "wet" dilution refrigerators, precool the $^3$He/$^4$He mixture using liquid nitrogen and $^4$He baths before further cooling of the $^3$He/$^4$He mixture below 4 K. Modern dilution refrigerators, or "dry" dilution refrigerators, precool the $^3$He/$^4$He mixture using devices such as a cryocooler rather than cryogenic liquid baths.

SUMMARY

Some embodiments are directed to a dilution refrigerator comprising: a plurality of thermalization plates configured to be cooled to a plurality of temperatures, wherein: a first thermalization plate of the plurality of thermalization plates comprises an integrated heat exchanger, the integrated heat exchanger comprises channels formed in the first thermalization plate, and the channels are configured to allow helium to flow through the first thermalization plate during operation of the dilution refrigerator.

In some embodiments, the integrated heat exchanger is formed by additive manufacturing.

In some embodiments, the first thermalization plate further comprises a detachable portion, the detachable portion comprising the integrated heat exchanger.

In some embodiments, the dilution refrigerator further comprises an interchangeable dilution insert detachably coupled to the detachable portion of the first thermalization plate.

In some embodiments, the dilution insert is detachably coupled to: a condensing line of the dilution refrigerator; and three thermalization plates of the plurality of thermalization plates.

In some embodiments, the dilution insert comprises a still configured to perform cooling by distilling $^3$He vapor from a mixture of $^3$He and $^4$He.

In some embodiments, the dilution refrigerator further comprises an experimental volume thermally coupled to a coldest thermalization plate of the plurality of thermalization plates; a still coupled to a second thermalization plate warmer than the coldest thermalization plate, the still being configured to perform cooling by distilling $^3$He vapor from a mixture of $^3$He and $^4$He; and a continuous heat exchanger disposed between the second thermalization plate and the coldest thermalization plate.

In some embodiments, the dilution refrigerator further comprises at least one heat exchanger thermally coupled to a thermalization plate of the plurality of thermalization plates, wherein the at least one heat exchanger comprises a nanomaterial.

In some embodiments, the nanomaterial comprises at least one or nanowires, nanofoams, nanopellets, and/or nanotubes.

In some embodiments, the nanomaterial comprises nanowires comprising one or more of copper nanowires, silver nanowires, gold nanowires, platinum nanowires, polymer nanowires, carbon nanowires, and/or carbon fiber nanowires.

In some embodiments, the at least one heat exchanger comprises one of a discrete heat exchanger and/or a heat exchanger disposed in a mixing chamber of the dilution refrigerator.

In some embodiments, the dilution refrigerator further comprises: a condensing line configured to transport helium to a coldest thermalization plate of the plurality of thermalization plates; a still disposed along the condensing line before the coldest thermalization plate; a heat exchanger disposed along the condensing line between the still and the coldest thermalization plate; and a heat exchange line configured to transfer a return helium mixture from the heat exchanger to the still and to decrease a temperature of a helium mixture in the condensing line at a location above the still.

In some embodiments, the dilution refrigerator further comprises a Joule-Thomson expander disposed along the condensing line before the still, wherein: the heat exchange line is configured to decrease the temperature of the helium mixture in the condensing line at a location before the Joule-Thomson expander.

In some embodiments, the dilution refrigerator further comprises: a condensing line configured to transport helium to a coldest thermalization plate of the plurality of thermalization plates; and a high-surface area material disposed along the condensing line and configured to cause the transported helium to adsorb to the high-surface area material during a cooldown cycle of the dilution refrigerator.

In some embodiments, a first end of the high-surface area material is switchably thermally coupled to a warmer thermalization plate of the plurality of thermalization plates by a first heat switch, and a second end opposite the first end of the high-surface area material is switchably thermally coupled to a colder thermalization plate of the plurality of thermalization plates by a second heat switch.

In some embodiments, the dilution refrigerator further comprises at least one heater thermally coupled to the high-surface area material and configured to cause, by heating the high-surface area material, the adsorbed helium to release from the high-surface area material and to be cooled by moving between a warmer thermalization plate of the plurality of thermalization plates to a colder thermalization plate of the plurality of thermalization plates.

In some embodiments, the dilution refrigerator further comprises: a first valve disposed along the condensing line between the warmer thermalization plate and the high-surface area material; and a second valve disposed along the condensing line between the high-surface area material and the colder thermalization plate, wherein: the first valve and the second valve are configured to, when the first valve is closed and the second valve is opened, cause helium adsorbed onto the high-surface area material to be transported from the warmer thermalization plate to the colder thermalization plate.

In some embodiments, the high-surface area material comprises one of activated charcoal or a metal powder.

In some embodiments, the dilution refrigerator further comprises: a condensing line configured to transport helium from a helium inlet to a coldest thermalization plate of the plurality of thermalization plates; a first helium filter disposed along the condensing line; a second helium filter disposed in parallel with the first helium filter along the condensing line; and at least one valve configured to switch a flow of helium along the condensing line between the first helium filter and the second helium filter.

In some embodiments, the first helium filter and/or the second helium filter comprises a charcoal trap.

In some embodiments, the dilution refrigerator further comprises: a first counterflow heat exchanger disposed between the first helium filter and the helium inlet; and a second counterflow heat exchanger disposed between the second helium filter and the helium inlet.

In some embodiments, the dilution refrigerator further comprises: a condensing line configured to transport helium to a coldest thermalization plate of the plurality of thermalization plates; a Joule-Thomson expander disposed along the condensing line; and a bypass disposed in parallel with the Joule-Thomson expander along the condensing line, the bypass configured to allow the transported helium to bypass the Joule-Thomson expander when the transported helium has a temperature above a threshold value and below 300 K.

In some embodiments, the bypass comprises a material configured to allow the transported helium to diffuse through the material when the transported helium has a temperature above the threshold value and below 300K. In some embodiments, the material comprises a polymer.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Dilution refrigerators are cryogenic devices that can provide cooling down to temperatures between approximately 2 mK and 1 K and are used in a variety of applications requiring these extremely low temperatures. For example, dilution refrigerators can be used to support quantum computing (e.g., superconducting quantum computing technologies and qubits) and low-temperature condensed matter physics research, among other applications.

As described above, dilution refrigerators rely on the heat of mixing of $^3$He and $^4$He isotopes to provide cooling. When cooled below approximately 870 mK, a $^3$He/$^4$He mixture undergoes spontaneous phase separation to form a $^3$He-rich phase (the "concentrated" phase) and a $^3$He-poor phase (the "dilute" phase). These two phases are maintained in equilibrium in a mixing chamber, the coldest part of the dilution refrigerator, and are separated by a phase boundary. In the mixing chamber, the $^3$He is diluted as it moves from the concentrated phase through the phase boundary into the dilute phase, and the heat necessary for this endothermic dilution process provides the cooling power of the dilution refrigerator.

However, conventional dilution refrigerators can suffer from a multitude of drawbacks and failure points. For example, wet dilution refrigerators require significant amounts of liquid cryogens, which are costly to maintain and supply. As another example, dry dilution refrigerators can be subject to unwanted mechanical vibrations introduced by the cryocooler system and/or may draw large amounts of energy to power the cryocooler.

Conventional dilution refrigerators also typically occupy a large footprint, which may be prohibitive for applications requiring multiple dilution refrigerators. For example, a single conventional dry dilution refrigerator typically requires approximately 300 square feet and ceiling heights between 12 and 14 feet. This space is occupied not only by the dilution refrigerator itself but is also required to support any auxiliary systems such as pumps, compressors, water cooling systems and/or cryocooler systems.

The inventors have recognized and appreciated that, for quantum computing and other quantum technologies to be easily scalable, the quantum technology industry needs reliable, easy-to-use, easy-to-maintain, and compact dilution refrigerators. Accordingly, the inventors have developed dilution refrigerators and distributed cooling systems that can be integrated with commercially available server rack infrastructure (e.g., 19-inch server racks). Additionally, the inventors have developed a number of features, described herein, to ease maintenance of the dilution refrigerators, speed cooling of the dilution refrigerators without the use of mechanical pumps, and to reduce the transmission of mechanical vibrations to the experimental volume of the dilution refrigerator.

I. Improved Closed-Cycle Dilution Refrigerator

Figure 1:
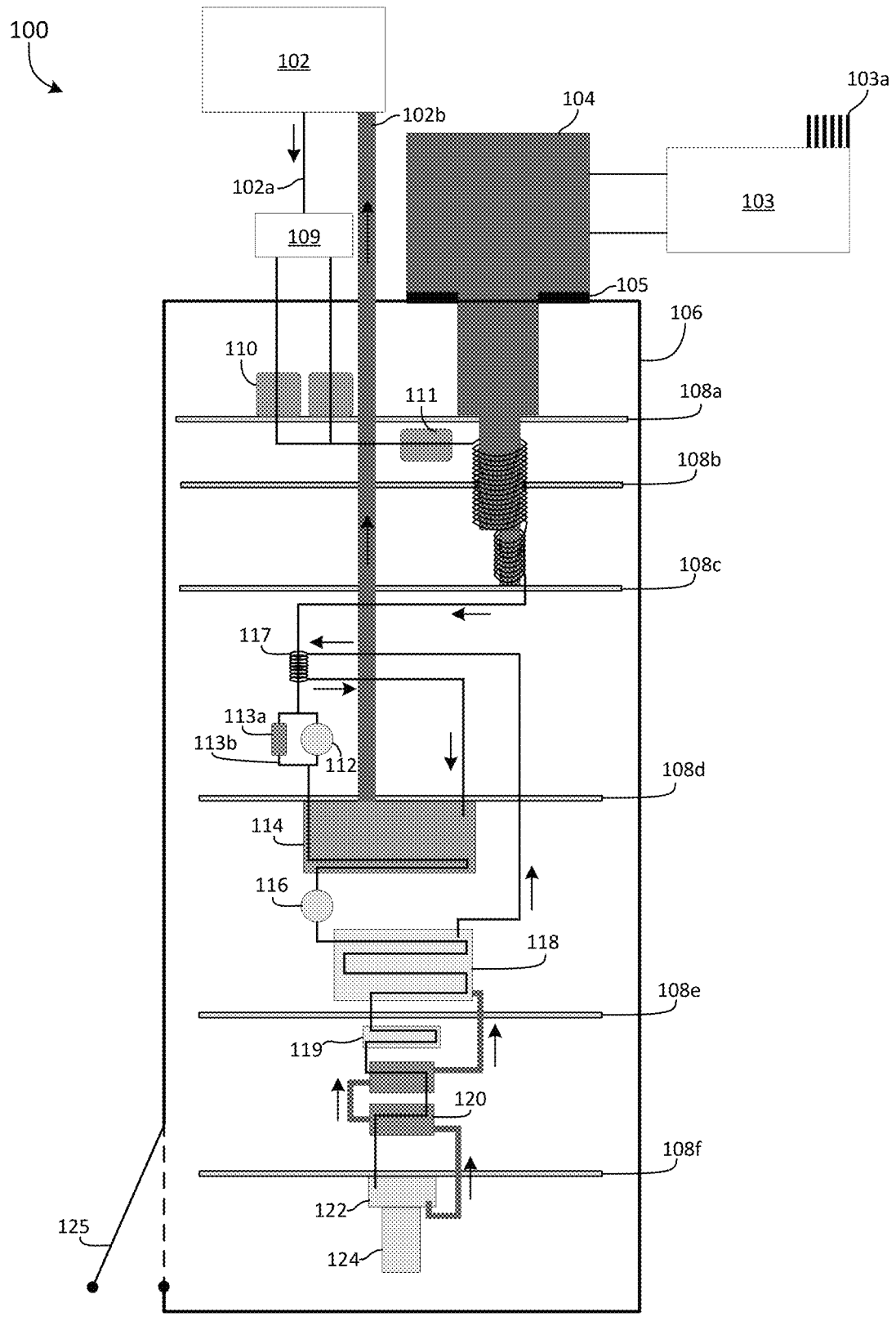
FIG. 1 is a schematic diagram of a closed-cycle dilution refrigerator, in accordance with some embodiments described herein.

FIG. 1 is a schematic diagram of a dry, closed-cycle dilution refrigerator 100, in accordance with some embodiments described herein. In some embodiments, the dilution refrigerator 100 includes an outer vacuum chamber 106 at room temperature (e.g., approximately 300K) and a number of thermal stages 108a-108f (e.g., thermalization plates) held at decreasing temperature intervals (e.g., approximately 50 K, 9-10 K, 3 K, etc.). For example, the first thermal stage 108a may be at approximately 50 K, the second thermal stage 108b may be at approximately 9-10 K, the third thermal stage 108c may be at approximately 3-4 K, the fourth thermal stage 108d may be at approximately 800 mK, the fifth thermal stage 108e may be at approximately 100 mK, and the sixth thermal stage 108f may be at approximately 10 mK.

In some embodiments, the dilution refrigerator 100 may include a pump system 102 that pressurizes a $^3$He/$^4$He gas mixture (e.g., to a pressure at or near 1 bar). The $^3$He/$^4$He gas mixture may enter the outer vacuum chamber 106 through one or more inlets and thereafter may travel through the inner thermal stages 108a-108f through the condensing line 102a. After performing its cooling function, the $^3$He/$^4$He mixture may return to the pump system through the return 102b.

In some embodiments, the $^3$He/$^4$He mixture may be purified prior to traveling along the condensing line 102a through the thermal stages 108a-108f. Contaminants in the helium flowing through the dilution refrigerator can clog certain components (e.g., the Joule-Thomson expander or capillaries in the heat exchangers) and lead to performance degradation or system failure. Conventionally, to reduce the risk of contaminants making their way into the system, helium is first passed through an external 'cleaning trap' filled with activated charcoal before entering the dilution unit of the dilution refrigerator. These external traps must be surrounded by liquid nitrogen and refilled at frequent intervals, which requires user maintenance and interaction.

The inventors have recognized and appreciated that passive helium filters, without the need for refilling of liquid nitrogen, can improve the user experience and reduce maintenance frequency of a dilution refrigeration system. Accordingly, in some embodiments, the dilution refrigerator 100 includes one or more helium cleaning devices 110. In some embodiments, where the dilution refrigerator 100 includes two or more helium cleaning devices 110, the dilution refrigerator 100 may further include a switching system 109 configured to direct the flow of the helium to a single helium cleaning device 110.

Figure 2:
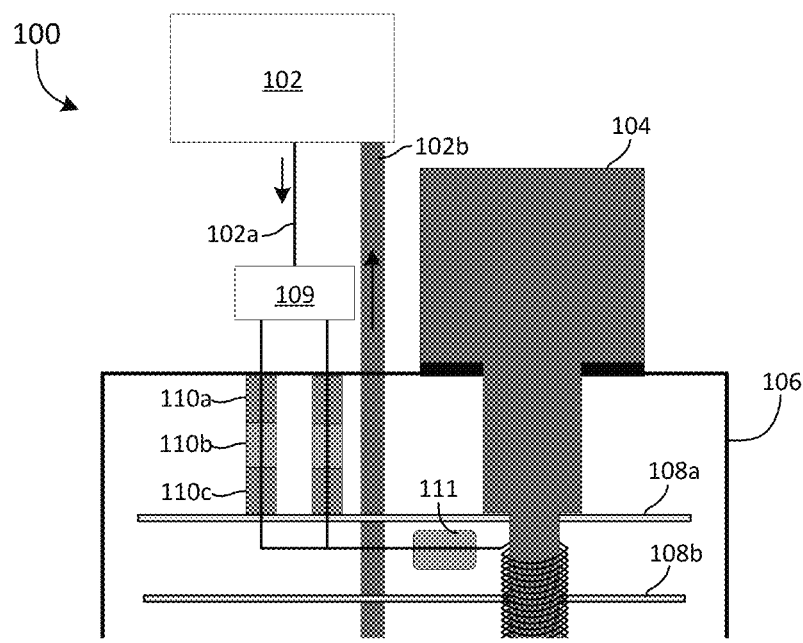
FIG. 2 is a schematic diagram of helium cleaning devices in the dilution refrigerator of FIG. 1, in accordance with some embodiments described herein.

FIG. 2 shows a schematic diagram of helium cleaning devices 110, in accordance with some embodiments described herein. The helium cleaning devices 110 may be coupled to the pump system 102 by a switching system 109 that is disposed outside of the outer vacuum chamber 106. The switching system 109 may include one or more helium-compatible valves. The switching system 109 may be configured to switch helium flow between each of the helium cleaning devices 110. In this manner, one helium cleaning device 110 may be used for actively filtering helium while the dilution refrigerator is in operation while the other helium cleaning device may be cleaned (e.g., by heating and pumping out of impurities), enabling indefinite periods of operation of the dilution refrigerator 100.

In some embodiments, the helium cleaning devices 110 include a counter flow heat exchanger 110a, a trap 110b, and a weak thermal contact 110c (e.g., a gas gap heat exchanger, a low thermal conductivity attachment, etc.). The counter flow heat exchanger 110a and the weak thermal contact 110c may reduce the thermal load of the helium cleaning devices 110 on the dilution refrigerator 100 and may eliminate the use of cryogenic valves in the helium cleaning devices 110. The trap 110b may include, for example, a high surface area material (e.g., charcoal, activated charcoal, and/or a metal powder) configured to capture non-helium impurities in the dilution refrigerator 100.

Returning to FIG. 1, in some embodiments, the dilution refrigerator 100 may include a cooldown turbo charger device 111. Dry dilution refrigerators conventionally use an auxiliary compressor to enable the flow of warm helium, which initially has a high impedance and resists such movement. The extra pressure from the auxiliary compressor also pressurizes the helium, causing the helium to reach a pressure that starts isenthalpic expansion and cooling at a higher temperature. These auxiliary mechanical compressor pumps are costly, prone to reliability issues, frequently leak, and can cause performance degradation over time. The inventors have recognized and appreciated that, alternatively, the helium may be pulsed through the dilution refrigerator during cooldown without the use of an auxiliary mechanical pump, enabling a faster and more efficient cooldown process.

Figure 3:
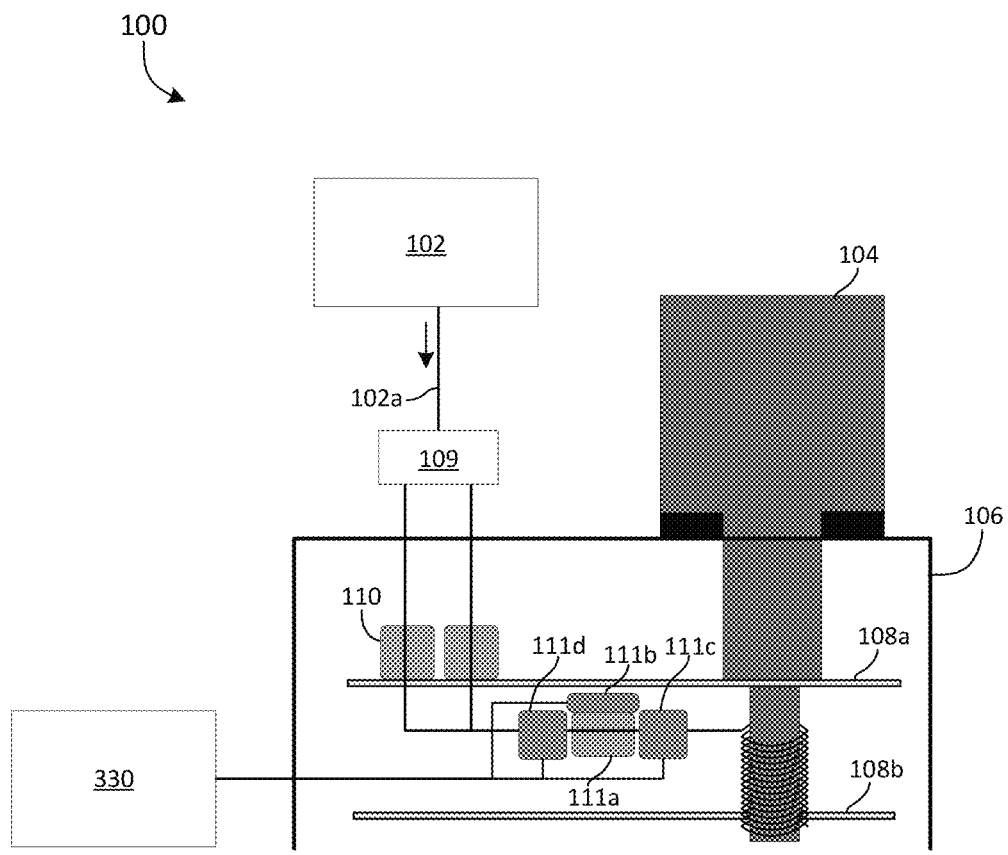
FIG. 3 is a schematic diagram of a cooldown turbo charger device in the dilution refrigerator of FIG. 1, in accordance with some embodiments described herein.

FIG. 3 shows a schematic diagram of a cooldown turbo charger device 111, in accordance with some embodiments described herein. The cooldown turbo charger device 111 may include a volume of a high surface area material 111a, a heater 111b, a first valve 111c, and a second valve 111d. The first and second valves 111c, 111d may be, for example, cold valves located inside the vacuum chamber 106. As another example, the first and second valves 111c, 111d may be room temperature valves located outside of the vacuum chamber 106. In some embodiments, the heater 111b and the first and second valves 111c, 111d may be communicatively coupled to a controller 330. The controller 330 may be, for example, a computer as described in connection with FIG. 14 herein.

In some embodiments, the cooldown turbo charger device 111 may be thermally coupled to a thermal stage (e.g., to a thermalization plate). In the example of FIG. 3, the high surface area material 111a is thermally coupled to the second thermal stage 108b, though it should be appreciated that the high surface area material 111a could be thermally coupled to another thermal stage in some embodiments (e.g., first thermal stage 108a).

Alternatively, in some embodiments, the cooldown turbo charger device 111 may be thermally coupled to multiple thermal stages (e.g., across two or more thermal stages 108a-108f). In such embodiments, the sequential heating and cooling of the high surface area material 111a may be mediated by heat switches. For example, the cooldown turbo charger device 111 may be switchably thermally coupled between a warmer thermal stage and a colder thermal stage such that the cooldown turbo charger device 111 may be thermally coupled to either the warmer thermal stage or the colder thermal stage. When the cooldown turbo charger device 111 is thermally coupled to the warmer thermal stage, the high surface area material 111a may release any adsorbed helium. When the cooldown turbo charger device 111 is thermally coupled to the colder thermal stage, helium may begin adsorbing to the high surface area material 111a. In this manner, a sequential flushing of helium through the condensing line 102a may be implemented.

In some embodiments, the high surface area material 111a may comprise a material with a porous and/or textured surface such that helium adsorbs to the high surface area material 111a during the cooldown process. For example, the high surface area material 111a may comprise activated charcoal, a metal powder (e.g., a copper or silver powder), and/or a material composite formed of nanostructures (e.g., nanowires, nanoparticles, etc.).

In some embodiments, the cooldown turbo charger device 111 may be operated using a sequential opening and closing of the valves 111c, 111d in concert with operation of the heater 111b. For example, to cause helium to adsorb the high surface area material 111a, the first valve 111c may be closed to prevent helium from flowing to the lower stages of the dilution refrigerator 100 and the second valve 111d may be opened to allow helium to reach the high surface area material 111a. The first valve 111c may be closed and the second valve 111d may be opened by the controller 330 in response to a measured pressure or temperature or in response to a timing signal generated by controller 330.

In some embodiments, after sufficient helium has adsorbed onto the high surface area material 111a, the second valve 111d may be closed and the first valve 111c may be opened. The first and second valves 111c, 111d may be opened and/or closed in response to measured temperatures or pressures and/or in response to a timing signal generated by controller 330.

In some embodiments, when the second valve 111d is closed and the first valve 111c is opened, the heater 111b may also be caused, at a same or similar time, to heat the high surface area material 111a in response to a signal generated by controller 330. For example, the heater 111b may be a resistive heater that is caused to heat the high surface area material 111a by a flow of current through the heater 111b. In response to the heat from the heater 111b, the helium adsorbed to the high surface area material 111a may act as a reserve that is then released from the high surface area material 111a. This release of the adsorbed helium may increase the pressure in the remainder of the condensing line 102a, and the increased pressure may enable the start of isenthalpic expansion to speed cooling of the dilution refrigerator 100.

In some embodiments, once the helium has been released from the high surface area material 111a, the first valve 111c may be closed, the second valve 111d may be opened, and the heater 111b may be turned off by the controller 330, allowing new helium to adsorb to the high surface area material 111a. The controller 330 may be configured to periodically (e.g., at regular time intervals, at irregular time intervals, at time intervals determined by the temperature of the experimental volume, at time intervals determined by the pressure of the experimental volume) open and/or close the valves 111c, 111d and to operate the heater 111b to flush the helium intake path. In some embodiments, the controller 330 may be configured to "pulse" the helium from the high surface area material 111a through the condensing line 102a, causing the dilution refrigerator to be cooled.

Returning to FIG. 1, during operation of the dilution refrigerator, the $^3$He/$^4$He mixture may be progressively cooled as it travels along the condensing line 102a from the first thermal stage 108a to the mixing chamber 122. At the first thermal stage, the helium may be initially cooled to approximately 50 K. After exiting the cooldown turbo charger device, the $^3$He/$^4$He mixture may next be cooled by a cryocooler 104. A portion of the cryocooler 104 may be disposed partially outside of the outer vacuum chamber 106, in some embodiments. The cryocooler 104 may be vibrationally isolated from outer vacuum chamber 106 by a vibration isolation stage 105, which may comprise padding and/or any other suitable vibration isolation techniques.

In some embodiments, the cryocooler 104 may be coupled to a cryocooler support 103. The cryocooler support 103 may be, for example, a compressor and/or compression system, in some embodiments. The cryocooler support 103 may include cooling members 103a, in some embodiments, configured to provide air-cooling to the dilution refrigerator 100. The cooling members 103a may be, as a non-limiting example, cooling fins, fans, and/or heat pipes configured to remove waste heat generated by the cryocooler support 103 and/or the cryocooler 104.

The cooling members 103a are in contrast to conventional closed-cycle dilution refrigerators, which typically rely on water-cooling to remove waste heat generated by the integrated cryocooler. Water-cooling of the cryocooler, however, requires installing a large and/or expensive water-cooling system in conjunction with the dilution refrigerator. Additionally, such water-cooling systems are not typically integrated with commercial computing facilities, which typically rely on air-cooling as it is less expensive and does not present hazards (e.g., leaking coolant, flooding, etc.) to the electronic equipment. The inventors have accordingly recognized that using air-cooling to remove heat from the cryocooler of the dilution refrigerator may reduce the costs of manufacturing dilution refrigerators and enable their use in commercial computing facilities.

In some embodiments, the dilution refrigerator 100 may be disposed above a plenum (not pictured) disposed under a floor supporting the dilution refrigerator. The plenum may supply the cooling members 103a with air flow to provide air-cooling. In some embodiments, the cooling members 103a may include inlets and/or louvers configured to draw in air from the plenum. Alternatively or additionally, in some embodiments, the dilution refrigerator 100 may be disposed in a facility including ductwork and/or heat pipes (not pictured) arranged to remove heat from the cooling members 103a, the cryocooler support 103, and/or the cryocooler 104 and to minimize vibrations experienced by the dilution refrigerator 100.

In some embodiments, the $^3$He/$^4$He mixture may be cooled by the cryocooler 104 in two steps. The condensing line 102a may be wound around two portions of the cryocooler 104 to effect heat exchange between the $^3$He/$^4$He mixture in the condensing line 102a and the cryocooler 104. In a first step, the $^3$He/$^4$He mixture may be cooled to approximately 10 K by the cryocooler 104. In a second step, the $^3$He/$^4$He mixture may be cooled to approximately 3-4 K by the cryocooler 104.

In some embodiments, after being cooled by the cryocooler 104, the $^3$He/$^4$He mixture may pass through the third thermal stage 108c. The third thermal stage 108c may be thermally coupled but mechanically decoupled from cryocooler 104, in some embodiments, in order to provide vibration isolation to the later thermal stages 108d-108f. As a non-limiting example, in some embodiments, third thermal stage 108c may be mechanically decoupled from the cryocooler by a copper braid, heat strap, or other hanging component configured to maintain thermal coupling between the third thermal stage 108c and the cryocooler 104.

In some embodiments, after passing through the third thermal stage 108c, the $^3$He/$^4$He mixture may enter a primary impedance stage 112. The primary impedance stage 112 may be a Joule-Thomson expander configured to reduce the temperature and/or pressure of the $^3$He/$^4$He mixture. For example, in some embodiments, the $^3$He/$^4$He mixture may be at approximately 3-5 K before entering the primary impedance stage 112 and may be at approximately 1 K after exiting the primary impedance stage 112.

In some embodiments, the primary impedance stage 112 may be a Joule-Thomson expander formed from a fiber optic cable. Conventionally, Joule-Thomson expanders may be formed as metal tubes that are manufactured by pulling. However, such metal Joule-Thomson expanders may suffer from irregularities and/or may have a larger diameter that reduces the cooling power of the device. A hollow-core fiber optic cable may reliably and reproducibly provide the narrow opening needed for a Joule-Thomson expander.

In some embodiments, the dilution refrigerator 100 may include a bypass device 113a configured to increase the speed of cooldown of the dilution refrigerator 100. For example, during the initial cooldown of a dilution refrigerator, the helium flow rate may be low due to the large impedance of Joule-Thomson expanders in the dilution refrigerator and the warm, low density, and viscous circulating helium. This reduced helium flow rate reduces the rate of cooling of the lower portions of the refrigerator. To combat this effect, conventionally, a needle valve may be incorporated at a location on the condensing line above the Joule-Thomson expander to reduce the impedance of the initially-warm helium gas. However, the needle valve includes mechanical components that may fail over time. The inventors have recognized and appreciated that the helium flow rate may be improved without reliance on a mechanical component such as a needle valve.

In some embodiments, the bypass device 113a may be disposed along the condensing line 102a in parallel with the primary impedance stage 112 and on a bypass line 113b that bypasses the primary impedance stage 112 (e.g., allowing the $^3$He/$^4$He mixture to flow around the primary impedance stage 112). The bypass device 113a may include a sheet of vacuum-compatible material configured to allow helium to diffuse through the material at temperatures above a threshold temperature value. For example, the bypass device 113a may allow the $^3$He/$^4$He mixture to diffuse through the bypass device 113a at temperatures in a range from approximately 40 K to 300 K, in a range from 50 K to 300 K, in a range from 80 K to 300 K, in a range from 100 K to 300 K, in a range from 150 K, or in any range within those ranges. In some embodiments, the bypass device 113a may include a sheet of a vacuum-compatible polymer material. For example, the bypass device 113a may be formed of a sheet of Kapton, PEEK, and/or mylar, as some non-limiting examples. The bypass device 113a therefore allows for the high impedance of the primary impedance stage 112 to be circumvented when the $^3$He/$^4$He mixture is warm, thereby increasing the helium flow rate and rate of cooling of the dilution refrigerator 100. When the dilution refrigerator 100 has cooled sufficiently (e.g., to below the threshold temperature value), the $^3$He/$^4$He mixture will no longer diffuse through the bypass device 113a and instead will flow through the primary impedance stage 112. In some embodiments, after exiting the primary impedance stage 112 or the bypass device 113a, the $^3$He/$^4$He mixture then travels past the fourth thermal stage 108d and into the still 114. The still 114 may contain a different mixture of liquid $^3$He/$^4$He that cools the incoming $^3$He/$^4$He mixture as it passes through the condensing line 102a running through the still 114. In some embodiments, the $^3$He/$^4$He mixture in the condensing line may be cooled to approximately 400-900 mK by the still 114.

In some embodiments, the still 114 may include a membrane configured to use second sound to improve $^3$He evaporation within the still. Second sound is a superfluid phenomenon present in superfluid helium and may be produced, for example, when a porous membrane is oscillated or a heated wire is cycled within a bath of superfluid helium. The two-fluid model specifies that the superfluid helium in the mixture moves through the membrane while non-superfluid components of the helium bath cannot pass through the porous membrane as easily. In superfluid helium, this creates an enthalpy or temperature wave. Analogously in helium mixtures, the non-superfluid $^3$He may be preferentially pushed by the oscillating membrane while the superfluid $^4$He remains relatively stationary. The inventors have recognized and appreciated that this second sound phenomenon can be implemented within the still 114 to increase the $^3$He evaporation rate at a lower temperature and to reduce a concentration of $^4$He in the vapor above the liquid helium mixture in the still.

Figure 4:
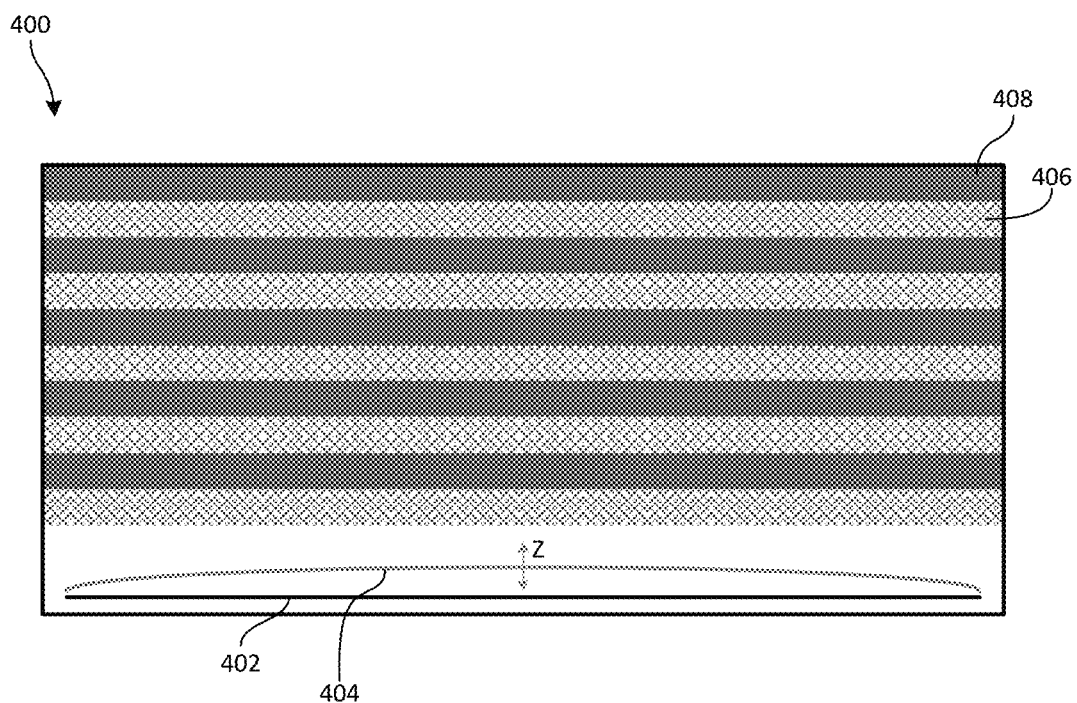
FIG. 4 is a schematic diagram of a still including a device to separate $^3$He and $^4$He using second sound effects, in accordance with some embodiments described herein.

FIG. 4 is a schematic diagram of a still 400 including a device to separate $^3$He and $^4$He using second sound effects, in accordance with some embodiments described herein. The still 400 may be implemented as still 114 of dilution refrigerator 100, in some embodiments. The still 400 may include a stationary surface 402 and a porous, movable membrane 404. The porous membrane 404 may be oscillated along the Z direction to create standing concentration waves of $^3$He within the still so that there are regions 406 of lower $^3$He concentration and regions 408 of high $^3$He concentration. The standing wave may be tuned such that regions 408 of high $^3$He concentration are disposed adjacent an outlet of the still, thereby allowing for improved $^3$He purification.

Returning to FIG. 1, in some embodiments, after exiting the still 114, the $^3$He/$^4$He mixture may flow through the condensing line 102a to a secondary impedance stage 116.

The secondary impedance stage 116 may be configured to ensure that only liquid $^3$He/$^4$He proceeds further downstream in the dilution refrigerator 100 and that gas cavitation in the still 114 does not occur (e.g., by maintaining a threshold pressure in the still 114). The secondary impedance stage 116 may therefore reduce downstream cooling loads due to a latent heat of gaseous $^3$He/$^4$He.

In some embodiments, after exiting the secondary impedance stage 116, the $^3$He/$^4$He mixture may then flow into a first heat exchanger 118. The first heat exchanger 118 may be a continuous heat exchanger. For example, the first heat exchanger 118 may be a counterflow (e.g., a tube-tube heat exchanger), a cross-counterflow, and/or coflow heat exchanger. At the exit of the first heat exchanger 118, the $^3$He/$^4$He mixture in the condensing line 102a may be cooled to a temperature of approximately 20 mK.

In conventional closed-cycle dilution refrigerators, prior to entering the still, the $^3$He/$^4$He mixture in the condensing line typically must pass through a first impedance stage. This first impedance stage typically acts as an independent refrigeration stage, known as a Joule-Thomson refrigerator, where the $^3$He/$^4$He mixture is cooled by isenthalpic expansion. In order to control the cooling power of the $^3$He/$^4$He mixture expansion, the pressure of the $^3$He/$^4$He mixture in the condensing line is typically raised by an external compressor.

The inventors have recognized and appreciated that reducing the temperature of the $^3$He/$^4$He mixture prior to entering the first impedance stage can achieve the same cooling effect (e.g., the $^3$He/$^4$He mixture can reach the same base temperature after passing through the first impedance stage) while using a lower pressure differential. Such a configuration can improve the efficiency of the dilution refrigerator and reduce or eliminate the need to pressurize the $^3$He/$^4$He mixture before the first impedance stage. Further, the inventors have recognized that the heat removed from the $^3$He/$^4$He mixture prior to the first impedance stage can be returned to the still, thereby eliminating or reducing the need for a supplemental heater within the still to raise the vapor pressure, and enabling evaporation, of the different $^3$He/$^4$He mixture present in the still.

Accordingly, in some embodiments, the dilution refrigerator 100 may include a heat exchange line 117 configured to transfer heat from the incoming condensing line 102a to a return helium mixture being transported from the first heat exchanger 118 to the still 114. The heat exchange line 117 may cool the condensing line 102a at a location above the primary impedance stage 112. The heat exchange line 117 then cools the $^3$He/$^4$He mixture in the condensing line 102a prior to entering the primary impedance stage 112. Thereafter, the warmed mixture in the heat exchange line 117 is transported to the still 114.

Cooling the incoming $^3$He/$^4$He mixture before it enters the primary impedance stage 112 causes the primary impedance stage 112 to output a $^3$He/$^4$He mixture with a higher proportion of $^3$He in the liquid state rather than in the vapor state. Thus, the primary impedance stage 112 can be made more efficient by including the additional heat exchange line 117. Additionally, this improved efficiency eliminates or mitigates the need for supplemental pressure (e.g., an external compressor) and may lower the flow impedance of the circulating helium mixture. This is particularly useful in reducing the complexity and size of smaller dilution refrigerators that include smaller (i.e., less powerful) pulse tubes or other cryocoolers.

In some embodiments, after exiting the first heat exchanger 118, the $^3$He/$^4$He mixture passes through the fifth thermal stage 108e and enters continuous heat exchanger 119. The continuous heat exchanger 119 may be a counterflow (e.g., a tube-tube heat exchanger), a cross-counterflow, and/or coflow heat exchanger. The continuous heat exchanger 119 is disposed below the fifth thermal stage 108e. The fifth thermal stage 108e may be an intermediate cold plate (ICP) configured to be cooled to a temperature of approximately 100-200 mK. While continuous heat exchangers are typically more efficient than discrete heat exchangers, they become less efficient below a temperature of approximately 80 mK. However, adding continuous heat exchanger 119 below the fifth thermal stage 108e may enable the fifth thermal stage 108e to operate with more cooling power during the process of cooling down the dilution refrigerator.

In some embodiments, after exiting the continuous heat exchanger 119, the $^3$He/$^4$He mixture enters discrete heat exchangers 120. The discrete heat exchangers 120 may be formed of sintered nanoparticles, in some embodiments. Alternatively or additionally, in some embodiments the discrete heat exchangers 120 may be formed of sintered nanowires, as described herein in connection with FIGS. 7A-7D herein. The discrete heat exchangers 120 may be configured to further cool the $^3$He/$^4$He mixture to a temperature below approximately 10-20 mK.

Figure 5A:
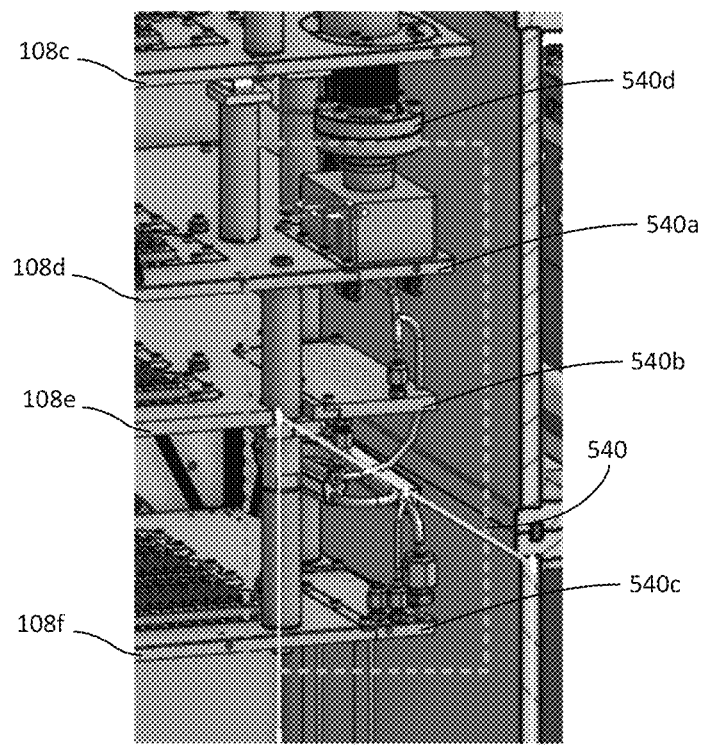
FIG. 5A shows illustrative components of a removable dilution insert for the dilution refrigerator of FIG. 1, in accordance with some embodiments described herein.

The inventors have additionally recognized and appreciated that the user experience may be improved by allowing users to easily swap parts in and out of the dilution refrigerator 100 (e.g., for maintenance, to change the characteristics of the dilution refrigerator 100, and/or to upgrade the dilution refrigerator 100 as technological innovations are developed). The inventors have accordingly developed a swappable dilution insert that is easily removed and replaced. FIG. 5A shows illustrative components of a removable dilution insert 540 for the dilution refrigerator 100 of FIG. 1, in accordance with some embodiments described herein.

In some embodiments, the removable dilution insert 540 includes detachable plates 540a, 540b, 540c removably coupled to thermal stages 108d, 108e, and 108f, respectively. As shown in the example of FIG. 5A, the detachable plates 540a, 540b, and 540c may be removably coupled using mechanical fasteners (e.g., bolts and/or screws). In some embodiments, the removable dilution insert 540 further includes detachable connections 540d above the still (e.g., flanges) and to the condensing line 102a to further simplify replacement of the removable dilution insert 540.

Figure 5B:
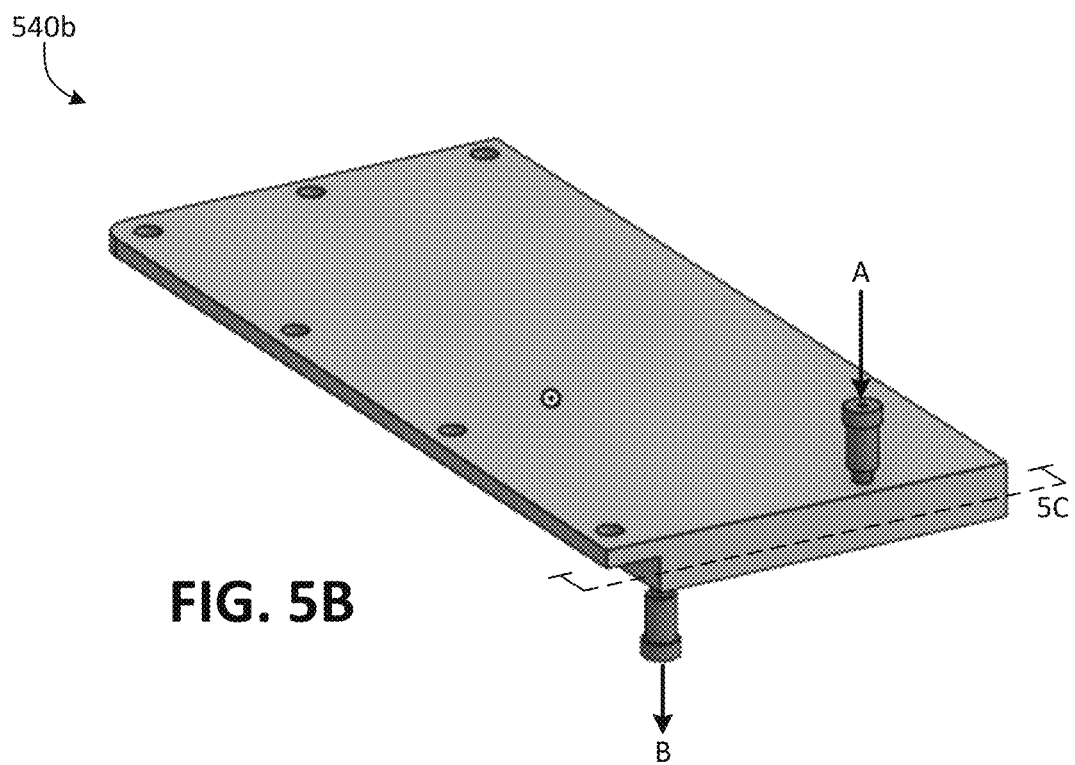
FIG. 5B is a view of an illustrative thermalization plate insert of the removable dilution insert of FIG. 5A, in accordance with some embodiments described herein.

FIG. 5B shows a close-up view of a detachable plate 540b of the removable dilution insert of FIG. 5A, in accordance with some embodiments described herein. The detachable plate 540b includes an input A and an outlet B to allow helium to flow through the detachable plate 540b, in some embodiments.

Figure 5C:
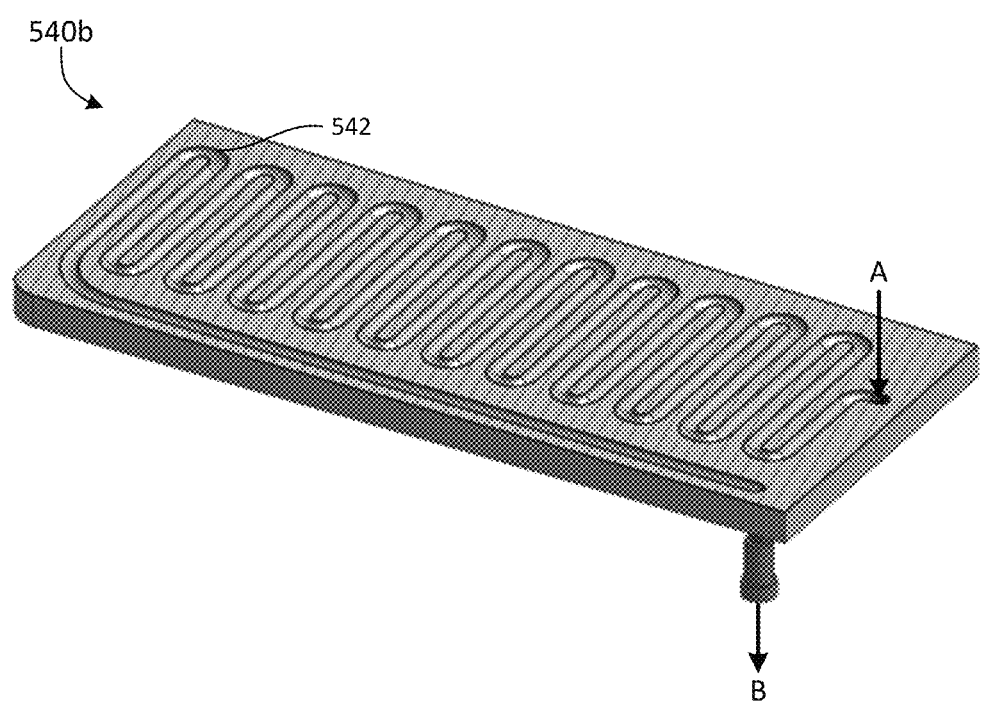
FIG. 5C is a cross-sectional view of an illustrative integrated heat exchanger showing channels for helium flow, in accordance with some embodiments described herein.

In some embodiments, the detachable plates 540a, 540b, and/or 540c may include integrated heat exchangers. In some embodiments, the integrated heat exchangers may be channels 542 formed in the detachable plates 540a and/or 540b, as illustrated by the example of FIG. 5C, which shows a cross section through the detachable plate 540b of FIG. 5B. The channels 542 may be configured to have a high surface area. By allowing helium to flow through the channels 542 in the detachable plates 540a and/or 540b, the helium's rate of cooling may be increased. In some embodiments, the channels 542 may be formed by machining, welding, and/or by additive fabrication techniques (e.g., three-dimensional printing techniques).

Figure 5D:
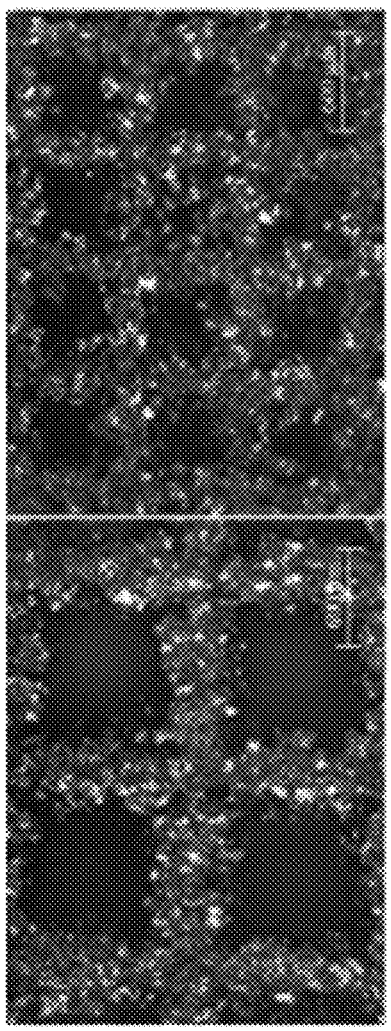
FIG. 5D is an image of a high surface area material for use in an integrated heat exchanger, in accordance with some embodiments described herein.

In some embodiments, the integrated heat exchangers may be a high surface area material structure formed in the detachable plate 540c. For example, the integrated heat exchangers may be a lattice structure, as shown in the example of FIG. 5D. The lattice structure may be, as a non-limiting example, a square lattice structure having a periodicity in a range from approximately 400 μm to approximately 1000 μm. For example, the lattice structure may have a periodicity of approximately 600 μm.

In some embodiments, the lattice structure may be fabricated using additive fabrication techniques (e.g., three-dimensional printing techniques). The lattice structure may be fabricated to have a rough surface texture to increase the surface area of the material in contact with the helium mixture passing through the integrated heat exchanger, thereby improving heat exchange. In some embodiments, the lattice structure may be formed of a metal. As non-limiting examples, the lattice structure may be formed of copper, silver, and/or aluminum.

Figure 5E:
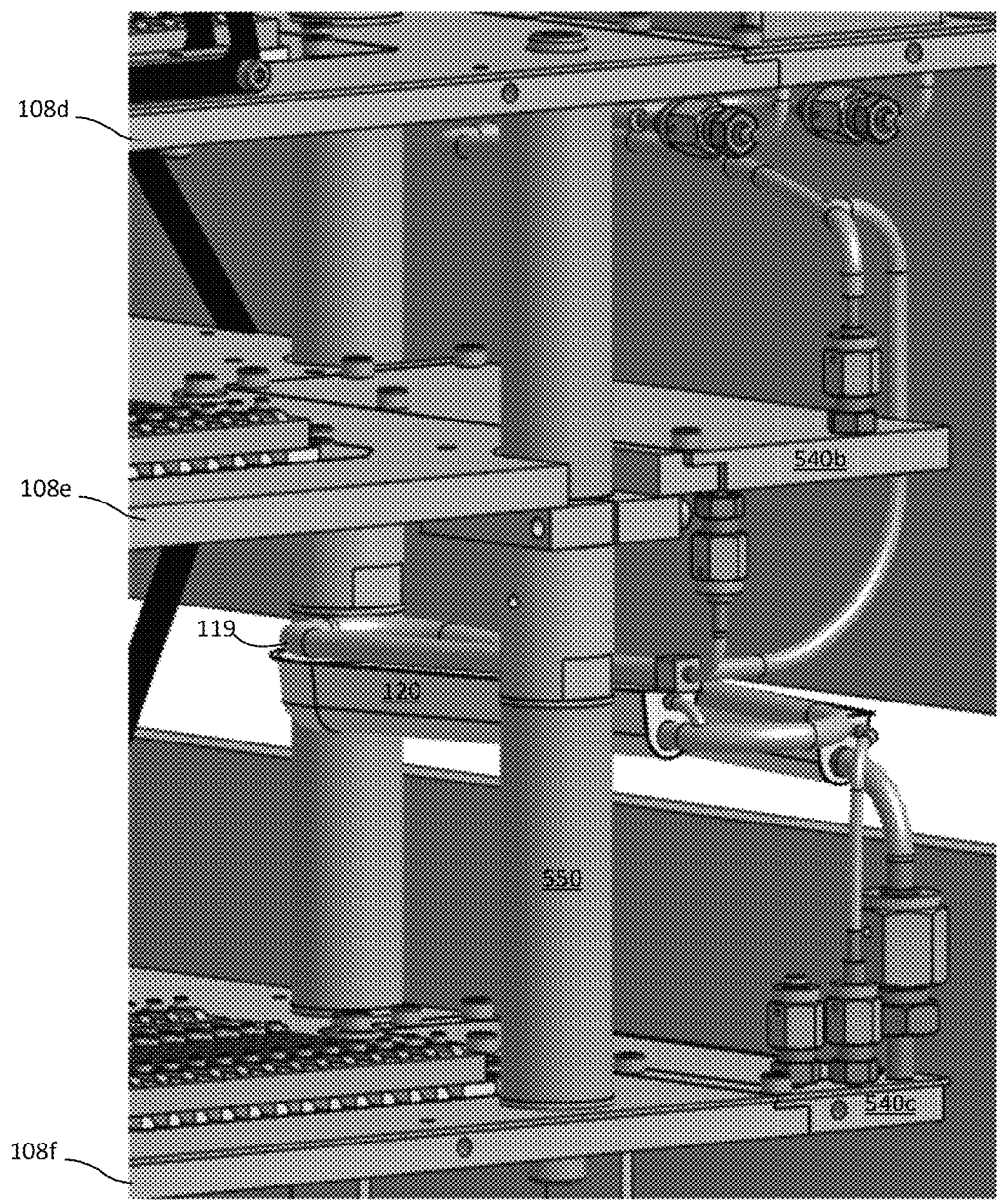
FIG. 5E is an illustrative implementation of a continuous heat exchanger and discrete heat exchanger of the dilution refrigerator of FIG. 1, in accordance with some embodiments described herein.

In some embodiments, the dilution insert 540 may include one or more heat exchangers, as described in connection with dilution refrigerator 100 of FIG. 1. FIG. 5E shows an illustrative implementation of a continuous heat exchanger 119 and discrete heat exchanger 120, in accordance with some embodiments described herein. As shown in FIG. 5E, the helium flows from the detachable plate 540b coupled to fifth thermal stage 108e into the continuous heat exchanger 119 followed by the discrete heat exchanger 120 and the detachable plate 540c.

Refrigeration cycles in cryogenic coolers typically use a method to control the flow of heat throughout the system. This control may be achieved with a superconductor, a gas gap, or other mechanisms to make or break a thermal connection between components within the system (i.e., heat switches). One common type of heat switch, a gas gap, typically comprises two high surface area objects with a small gap between them that is filled with a gas. As the system falls below a certain temperature, the conductive gas is adsorbed onto surface area in the heat switch, creating a vacuum and reducing heat transfer between the surfaces. Another common type of heat switch is a superconducting switch where a material passes through a superconducting transition and reduces thermal conductivity.

In some embodiments, the dilution refrigerator 100 may further include combined gas gap and/or superconducting heat switches between thermal stages of the dilution refrigerator 100. The example of FIG. 5E shows such a combined gas gap and superconducting heat switch 550 thermally coupled between thermal stages 108e and 108f.

The combined gas gap and superconducting heat switches 550 include both a superconducting material (e.g., aluminum, titanium) that becomes superconducting at a temperature higher than a target temperature of the thermal stage to which it is thermally coupled and a gas gap heat switch to improve thermal isolation between the thermal stages.

Returning to FIG. 1, after the $^3$He/$^4$He mixture exits the discrete heat exchanger 120, it passes through the sixth thermal stage 108f and enters the mixing chamber 122. In the mixing chamber 122, $^3$He atoms may be pumped from a concentrated phase into a dilute phase (i.e., mixed with $^4$He). This mixing causes the $^3$He to be cooled as it passes through the phase transition between the concentrated phase to the dilute phase, and this endothermic phase transition provides the final cooling power of the dilution refrigerator 100.

In some embodiments, an experimental volume 124 (e.g., a sample stage or plate) may be thermally coupled to the mixing chamber 122 and configured to support a sample and/or quantum device. Because the experimental volume 124 is thermally coupled to the mixing chamber 122, the sample and/or quantum device may be held at or near the mixing chamber temperature.

Figure 10A:
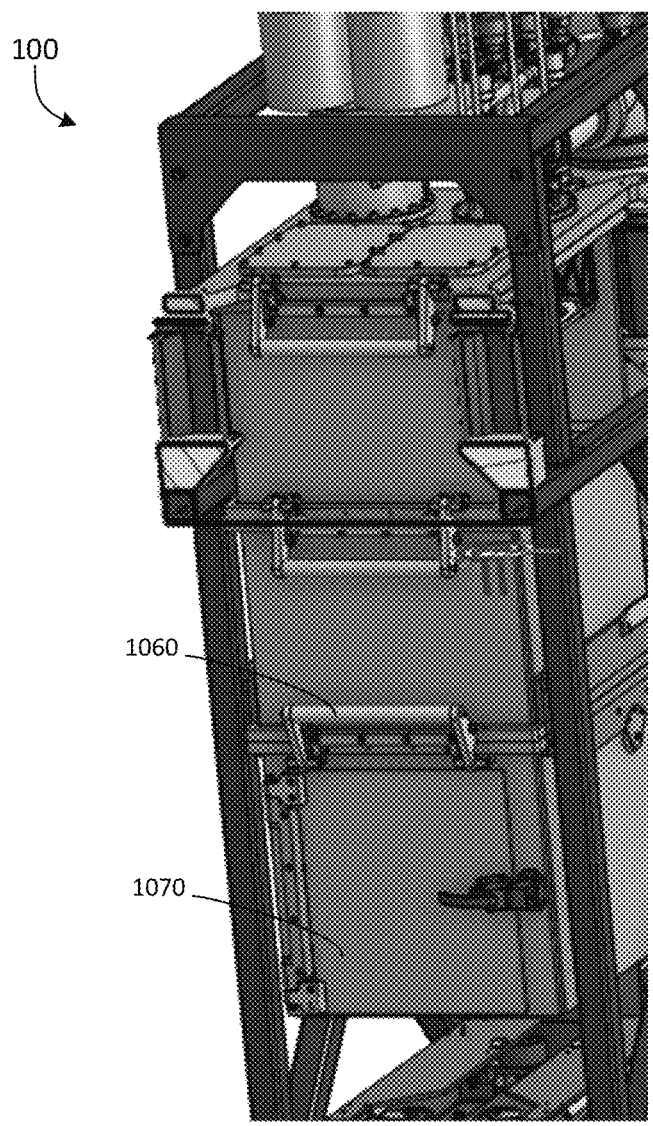
FIG. 10A is a side view of an illustrative implementation of the dilution refrigerator of FIG. 1 including elements configured to provide tool-free assembly of the vacuum chamber and access to the experimental volume, in accordance with some embodiments described herein.

In some embodiments, the experimental volume 124 may be accessed by the user when the dilution refrigerator 100 is not in operation through an opening in the vacuum chamber 106 and door 125. The door 125 may be, in some embodiments, a removable panel (e.g., secured with mechanical fasteners) or may be a hinged door that a user may open using a clamped handle (e.g., as shown in the example of FIG. 10A herein).

As illustrated in the example of FIG. 1, certain components of the dilution refrigerator 100 may be thermally coupled to a thermal stage and disposed on one side (e.g., above or below) the thermal stage. For example, the still 114 is shown as being disposed on a lower surface of the fourth thermal stage 108d. It should be appreciated that in some embodiments, such components may be disposed on either side of the associated thermal stage, as aspects of the technology described herein are not limited in this respect. For example, in some embodiments the still 114 may be disposed on an upper surface of the fourth thermal stage 108d. As another example, the helium cleaning devices 110 may be disposed on a lower surface of the first thermal stage 108a, in some embodiments.

In some embodiments, after entering the dilute phase, the $^3$He/$^4$He mixture may be pumped out of the mixing chamber 122 and back through the dilution refrigerator 100, exiting the outer vacuum chamber 106 through return 102b. At low temperatures and pressures, $^4$He forms a thick and mobile film that can move long distances across surfaces, including moving in a direction counter to the force of gravity. This helium creep can result in $^4$He entering portions of a dilution refrigeration system where it is unwanted (e.g., spanning the gap between thermally isolated areas). FIGS. 6A-6F are schematic diagrams of exemplary $^4$He separation devices that may be implemented at outlets in, for example, the mixing chamber 122 and/or the still 114, in accordance with some embodiments described herein.

Figure 6A:
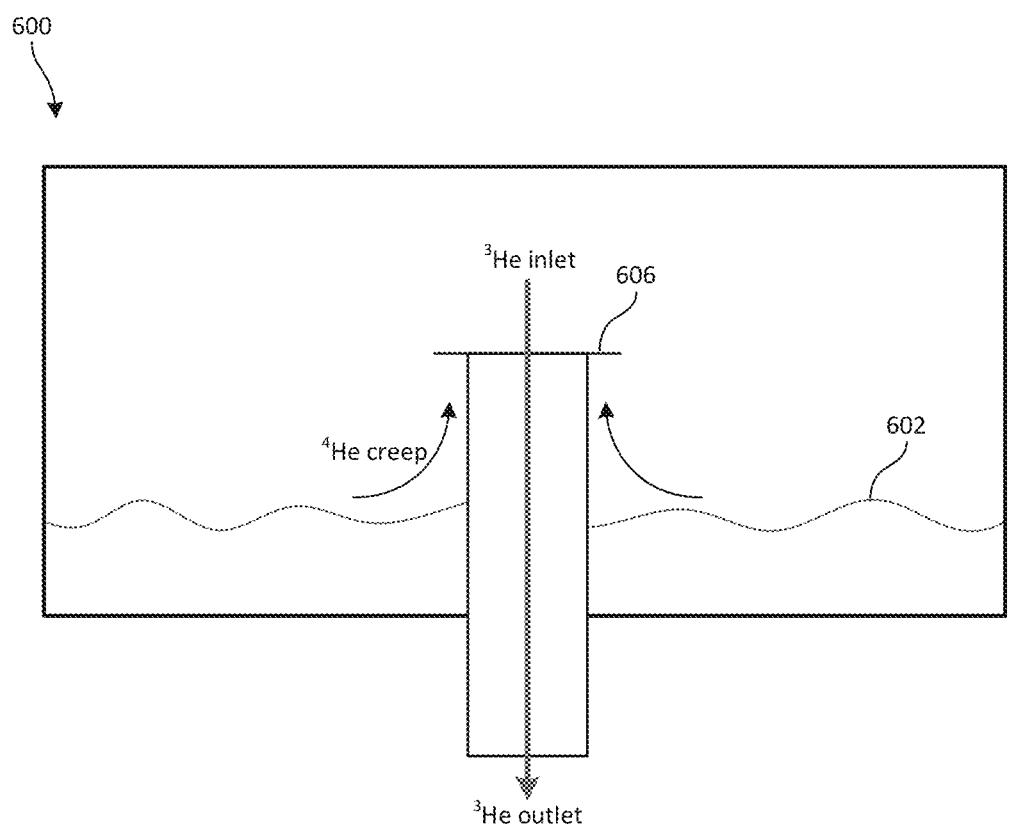
FIGS. 6A-6F are schematic diagrams of illustrative $^4$He film separation devices, in accordance with some embodiments described herein.

FIG. 6A illustrates a cooling stage 600 (e.g., a still, the mixing chamber, etc.) including a bath 602 of a dilute phase helium mixture (e.g., a $^3$He/$^4$He mixture), in some embodiments. $^4$He can creep up an outlet pipe (e.g., a still pumping outlet pipe, a mixing chamber outlet pipe) and exit the cooling stage 600 unless a barrier 606 prevents the helium creep. In the example of FIG. 6A, barrier 606 comprises a sharp edge at a right-angled surface configured to prevent helium from exiting the cooling stage 600 through the low pressure pumping outlet.

Figure 6B:
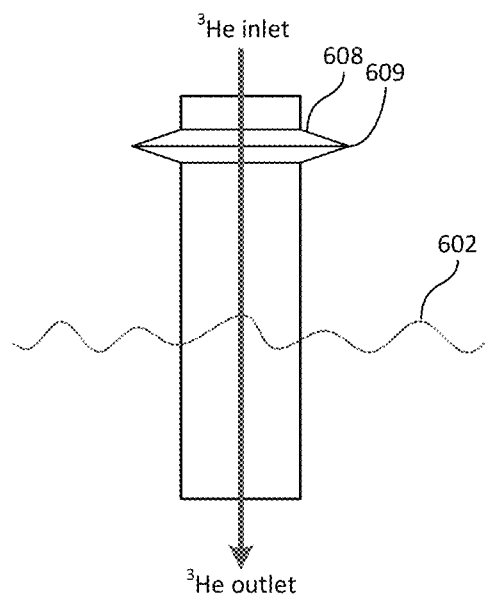

Other embodiments of a barrier configured to prevent $^4$He creep are shown in the examples of FIGS. 6B, 6C, 6D, and 6E. In the example of FIG. 6B, a ring 608 with a knife edge 609 is configured to prevent $^4$He from exiting through the $^3$He outlet. In some embodiments, the ring 608 may include a heating device (e.g., a resistive heater or any other suitable heater) configured to cause the creeping $^4$He to leave the superfluid phase, thereby mitigating creep.

Figure 6C:
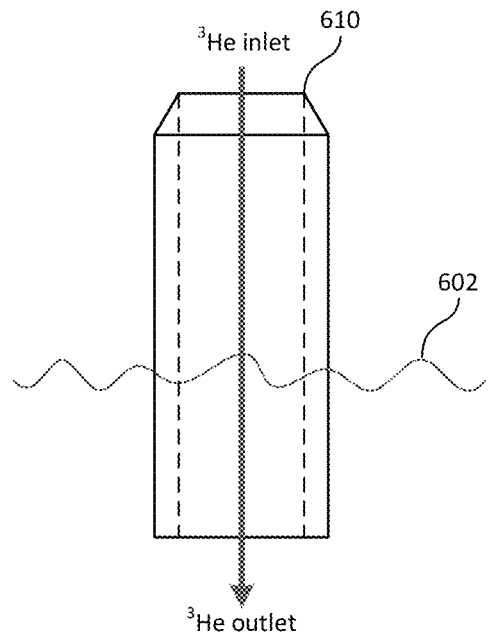
Figure 6D:
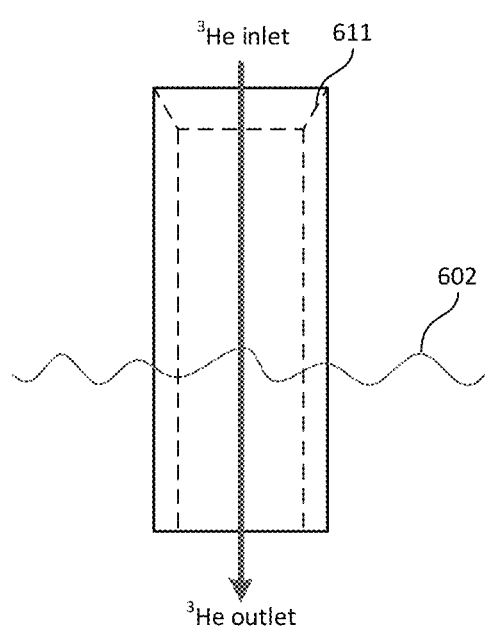
Figure 6E:
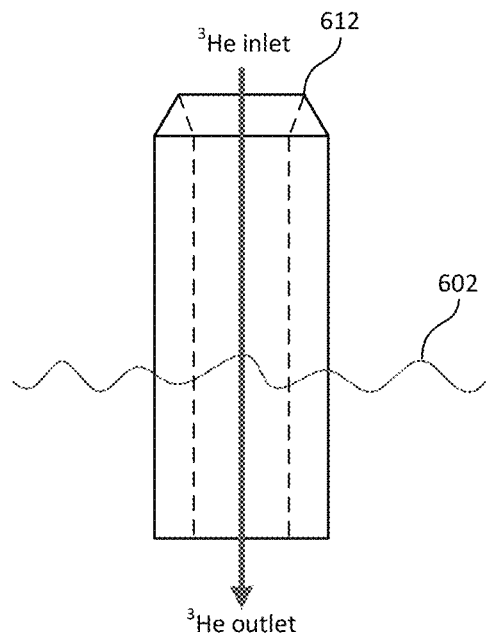

In the examples of FIGS. 6C, 6D, and 6E, vertical knife edges are used to prevent $^4$He from exiting through the $^3$He outlet. In some embodiments, and in the example of FIG. 6C, the knife edge 610 is on the exterior circumference of the outlet pipe. Alternatively, as shown in the example of FIG. 6D, the knife edge 611 may be beveled on the interior circumference of the outlet pipe. Further, as shown in the example of FIG. 6E, the knife edge 612 may be beveled on both the exterior and interior circumferences of the outlet pipe.

Figure 6F:
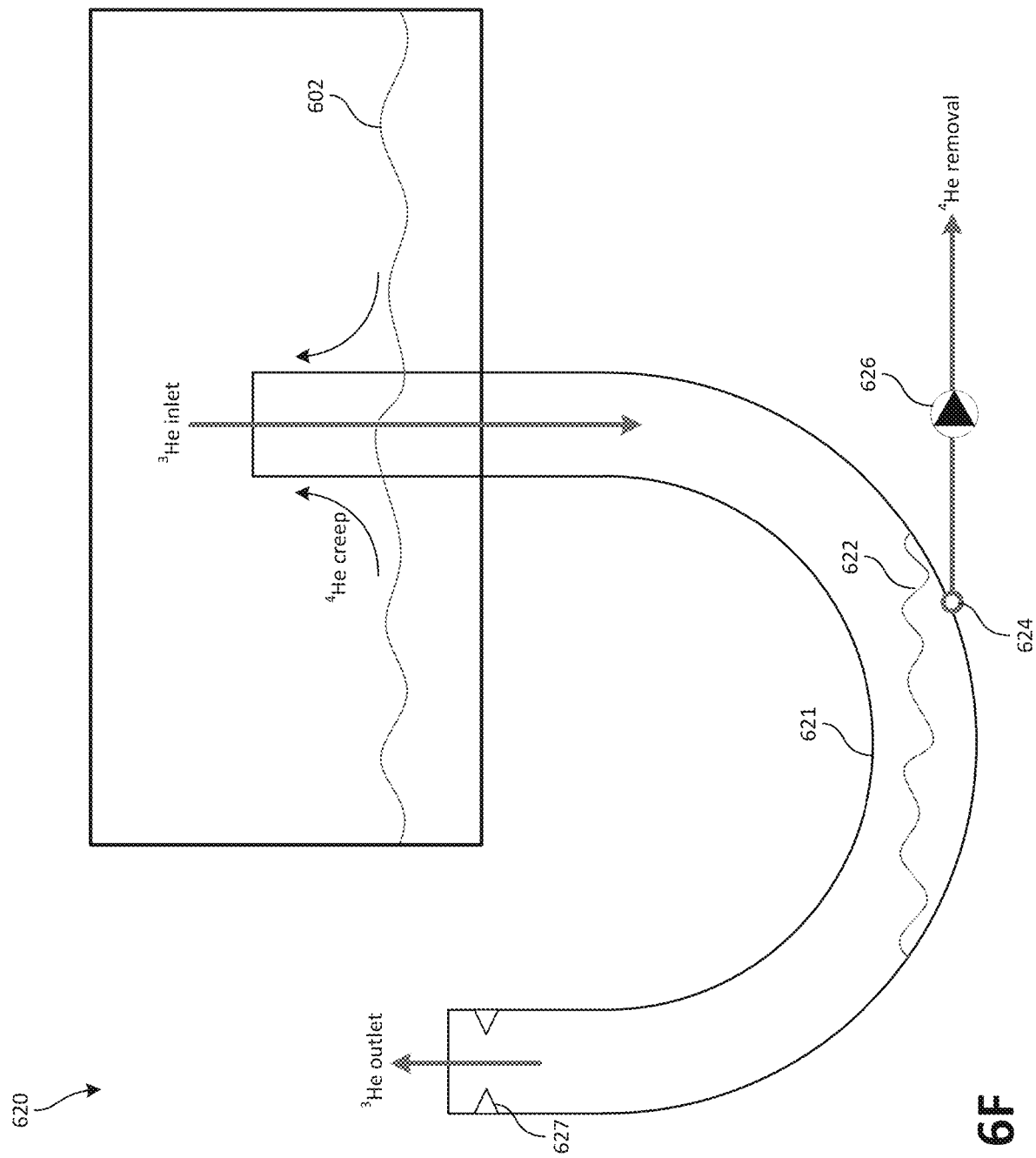

In some embodiments, and as shown in the example of FIG. 6F, the $^3$He outlet may include a p-trap 621 configured to collect $^4$He 622 at a lower surface of the p-trap 621. The $^3$He outlet may include a normal leak or a superleak 624 configured to allow normal or superfluid $^4$He to exit the p-trap 621, and a pump 626 (e.g., a fountain pump) may transport the $^4$He away from the p-trap 621. In some embodiments, a further barrier 627 may be present on an interior surface of the outlet pipe. For example, the barrier 627 may be configured as a ring. In some embodiments, the barrier 627 may include a heating device to further prevent $^4$He from exiting the outlet.

The inventors have recognized and appreciated that nanomaterials can provide advantages compared to conventional sintered metal powders (e.g., silver and/or copper powder) used in typical discrete heat exchangers. Accordingly, the inventors have developed nanomaterial heat exchangers that provide efficient heat exchange because of the nanomaterials' large surface area, high mechanical contact strength, and good neck growth between nanowires.

Figure 7A:
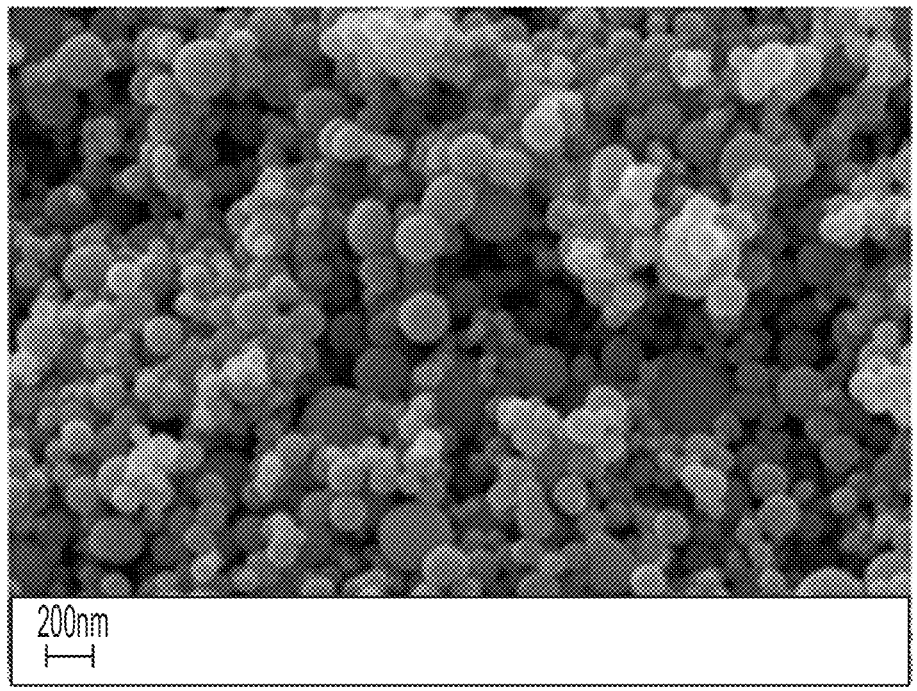
FIG. 7A is an image of sintered metal particles for use in a heat exchanger.

Typical discrete heat exchangers are commonly made out of sintered metal power (e.g., silver and/or copper powder). An example of such sintered particulates is shown in FIG. 7A. To have efficient heat exchange at the sub-Kelvin temperatures, however, a number of factors must be true with regards to the heat exchanger materials. The heat exchange material should have a large surface area, provide high mechanical and/or thermal contact between the liquid helium and the heat exchange material, allow for good neck growth, and provide space inside the heat exchange material for the liquid helium to move through the heat exchanger.

Figure 7B:
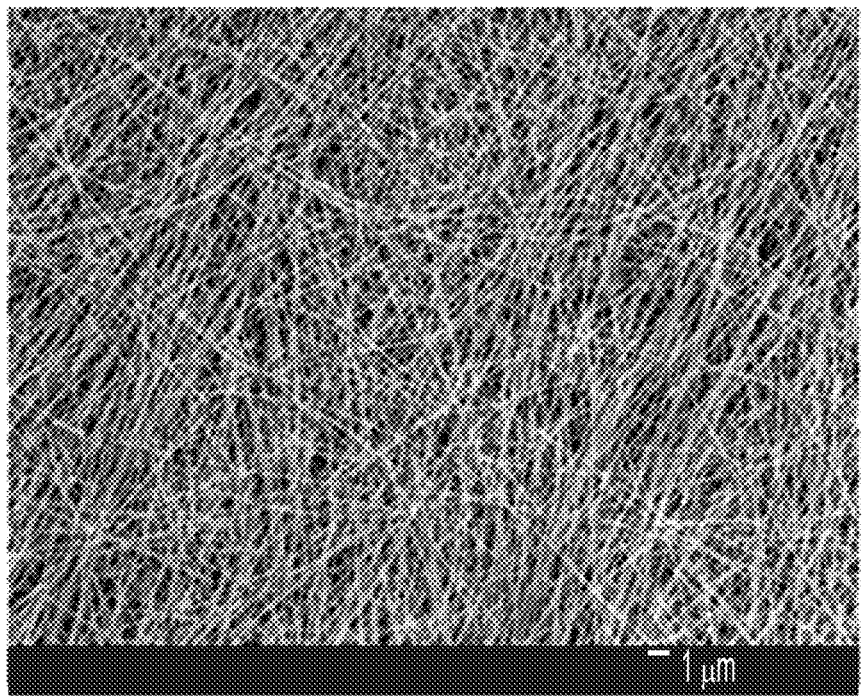
FIG. 7B is an image of nanowires for use in a heat exchanger, in accordance with some embodiments described herein.
Figure 7C:
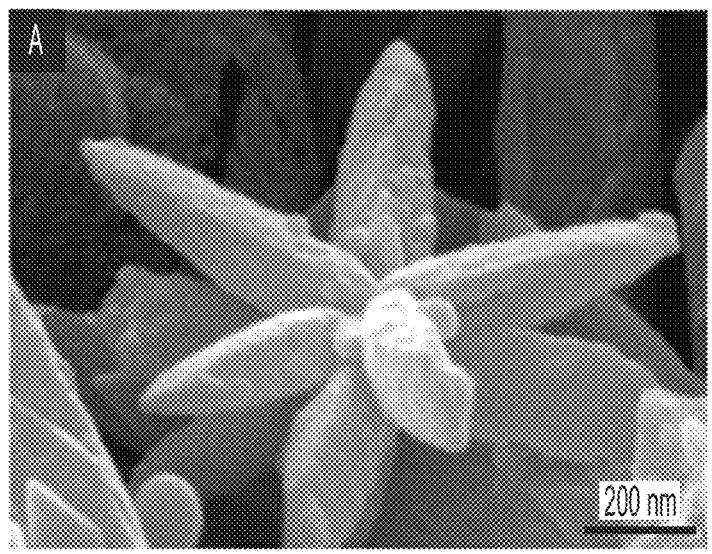
FIG. 7C is an image of a nanocluster for use in a heat exchanger, in accordance with some embodiments described herein.
Figure 7D:
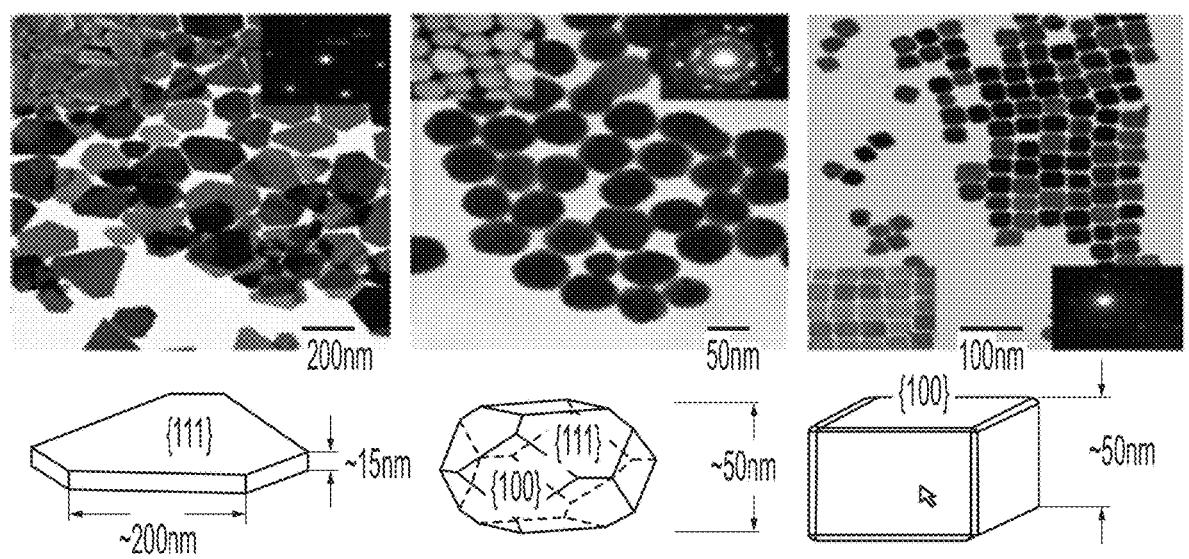
FIG. 7D includes images of different nanopellets for use in a heat exchanger in accordance with some embodiments described herein.

FIG. 7B shows an image of a nanomaterial comprising nanowires for use in a heat exchanger. FIG. 7C shows an image of a nanomaterial comprising nanoclusters for use in a heat exchanger. FIG. 7D shows images of nanomaterials comprising different examples of nanopellet shapes for use in a heat exchanger, in accordance with some embodiments described herein. These nanomaterials may be implemented in dilution refrigerator 100 in discrete heat exchanger 120 and/or in a block heat exchanger (e.g., present in the mixing chamber 122). It should be appreciated that FIGS. 7B-7D show examples of nanomaterial shapes, but that embodiments of nanomaterial for use in a discrete heat exchanger are not so limited. For example, the nanomaterial may alternatively be a nanofoam, nanotube, and/or any other suitable nanoshape.

In some embodiments, such a nanomaterial-based heat exchanger may be formed by bonding the nanomaterial through sintering. For example, the nanomaterial may be formed as a chemical precipitate and/or by electronic deposition or electroplating techniques. A substrate with a rough surface (e.g., comprising nucleation sites) may be provided for the nanomaterial to be grown on or adhered to. In some embodiments, the heat exchanger may be produced under heat and/or compression. The nanomaterial may be held in compression during the sintering process to form the nanowire heat exchanger. In some embodiments, the substrate may be patterned with macroscopic structures (e.g., a lattice or series of posts). In some embodiments, the substrate may be a tube, and the nanomaterial may be adhered to the interior or exterior surface of the tube. In some embodiments, the substrate may be formed of a material with a lower thermal conductivity than the nanomaterial adhered to the substrate.

In some embodiments, the nanomaterial may be formed out of one of a selection of vacuum-compatible materials including but not limited to copper, silver, vacuum-compatible polymers, carbon, and/or carbon fiber. For example, the nanomaterial may be nanowires comprising at least one of copper nanowires, silver nanowires, gold nanowires, platinum nanowires, polymer nanowires, carbon nanowires, and/or carbon fiber nanowires.

II. Improved Vibration Isolation

Many experiments conducted at sub-Kelvin temperatures are sensitive to vibrational noise both from the surrounding environment and the dilution refrigerator's cooling system pumps and components. Additionally, at sub-Kelvin temperatures, mechanical vibrations can generate a heat load, reducing the cooling power of the dilution refrigerator or producing tribo-electric noise on electrical inputs and/or outputs of the dilution refrigerator. The inventors have recognized and appreciated that improved vibration isolation can improve the cooling power and other performance characteristics (e.g., magnetic flux disruption) of a dilution refrigerator. Accordingly, the inventors have developed vibration isolation components configured to mechanically decouple the lower thermal stages 108d-108f from the upper thermal stages 108a-108c.

Figure 8A:
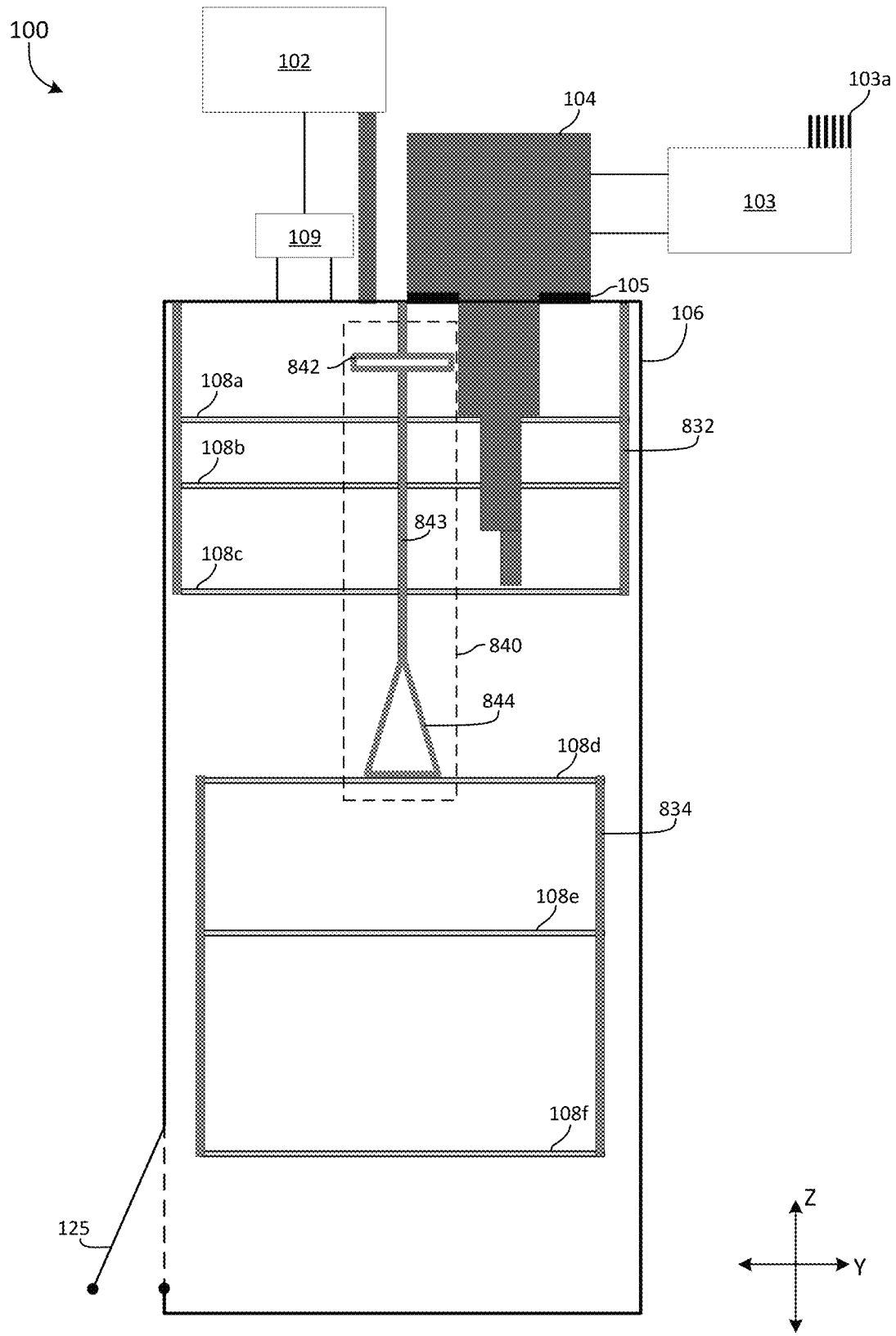
FIG. 8A is a schematic diagram of an illustrative vibration isolation system for use in the dilution refrigerator of FIG. 1, in accordance with some embodiments described herein.

FIG. 8A shows another schematic diagram of dilution refrigerator 100 including mechanical elements configured to provide vibration isolation, in accordance with some embodiments described herein. The vibration isolation elements include a first suspension system 832, at least one second suspension system 840, and a third suspension system 834.

In some embodiments, the first suspension system 832 may be configured to suspend the first thermal stage 108a, the second thermal stage 108b, and/or the third thermal stage 108c from the top surface of the outer vacuum chamber 106. The first suspension system 832 may include one or more rods configured to rigidly couple the first, second, and/or third thermal stages 108a-108c to the top surface of the outer vacuum chamber 106. The rods may be formed of a material having a high spring constant. For example, the rods may be formed of carbon fiber and/or stainless steel.

In some embodiments, the second suspension system 840 may be configured to independently suspend the fourth thermal stage 108d, the fifth thermal stage 108e, and/or the sixth thermal stage 108f from the top surface of the outer vacuum chamber 106. This independent suspension of the lower thermal stages 108d-108f vibrationally isolates the lower thermal stages 108d-108f from the upper thermal stages 108a-108c, thereby improving the vibration isolation of the lower thermal stages 108d-108f.

In some embodiments, the second suspension system 840 may include one or more springs 842, rods 843, and/or connectors 844. While the example of FIG. 8A shows only one second suspension system 840, it should be appreciated that multiple second suspension systems 840 may be used to suspend the lower thermal stages 108d-108f, in some embodiments. For example, there may be two, three, or four such second suspension systems 840, in some embodiments.

Figure 8B:
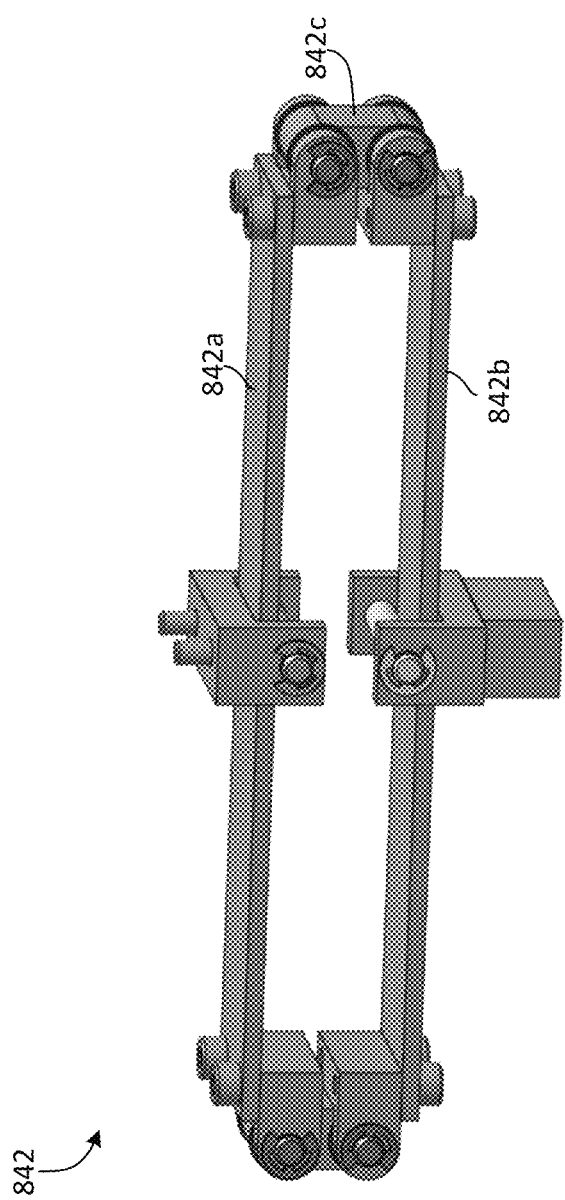
FIG. 8B shows an illustrative spring for use in the vibration isolation system of FIG. 8A, in accordance with some embodiments described herein.

In some embodiments, the springs 842 may be configured to provide a constant spring tension under different loads (e.g., for different dampened masses hanging from the springs 842). An example of a spring 842 is shown in FIG. 8B. The springs 842 may be leaf suspension springs, in some embodiments, and may include an upper flexure 842a separated from a lower flexure 842b by rigid portions 842c. The springs 842 may flex through the flexing of upper and lower flexures 842a, 842b, providing vibrational isolation to the lower thermal stages 108d-108f along the Z axis (e.g., perpendicular to a plane of the floor supporting the dilution refrigerator 100). In some embodiments, a spring constant of the spring 842 may be determined by pre-tensioning the upper and/or lower flexures 842a, 842b. Alternatively or additionally, the spring constant of the spring 842 may be determined by changing a length of the upper and/or lower flexures 842a, 842b (e.g., having a lower spring constant for longer lengths of flexures 842a, 842b).

In some embodiments, the springs 842 may be coupled to the third thermal stage 108d by rods 843. The rods 843 may be soft rods having a low spring constant. For example, the rods 843 may be formed out of a polymer (e.g., DELRIN), in some embodiments. The rods 843, due to their softness, may provide vibrational isolation to the lower thermal stages 108d-108f in the X-Y plane (e.g., in a plane parallel to a plane of the floor supporting the dilution refrigerator 100 and perpendicular to the Z axis).

In some embodiments, the connectors 844 may be arranged in a triangular configuration to provide stability to the suspension of the fourth thermal stage 108d. The connectors 844 may be made of materials configured to have a high spring constant. For example, the connectors 844 may be formed of stainless steel and/or carbon fiber.

In some embodiments, the third suspension system 834 may be configured to suspend the fifth thermal stage 108e and the sixth thermal stage 108f from the fourth thermal stage 108d. In this manner, the three lower thermal stages 108d-108f may all be suspended from the top surface of the vacuum chamber 106 using the second suspension system 840. The third suspension system 834 may include one or more rods configured to rigidly couple the fifth and/or sixth thermal stages 108e, 108f to the fourth thermal stage 108d. The rods may be formed of a material having a high spring constant. For example, the rods may be formed of carbon fiber and/or stainless steel, in some embodiments.

It should be appreciated that while the example of FIG. 8A shows the first and third suspension systems 832, 834 as being formed out of rods, in some embodiments, the first and/or the third suspension system 832, 834 may be formed out of flexible springs, as aspects of the present disclosure are not limited in this respect. Additionally, it should be appreciated that while the example of FIG. 8A shows the second suspension system 840 as being formed out of springs, in some embodiments, the second suspension system 840 may be formed out of rods, as aspects of the present disclosure are not limited in this respect.

III. Integrated Dilution Refrigerator

Conventional dilution refrigerator technology often requires large amounts of space and expensive supporting infrastructure such as custom-built floating foundations, high ceilings, and/or access pits. These infrastructure requirements may reduce the scalability of quantum technologies that operate at low temperatures. As a non-limiting example, the adoption of certain quantum computing technologies may be limited by the required use of large dilution refrigerators. The inventors have recognized and appreciated that reducing the size and infrastructure requirements of dilution refrigerators may enable the scalability of quantum technologies. The inventors have further recognized that integrating dilution refrigerators with commercial computing infrastructure (e.g., commercial server infrastructure) can further enable the scalability of dilution refrigerators and associated quantum technologies dependent on dilution refrigerators. Such integrated dilution refrigerators may be more easily integrated into telecommunications networks, can use existing telecommunications heat removal architectures, and integrate with fiberoptic networks and systems.

Figure 9:
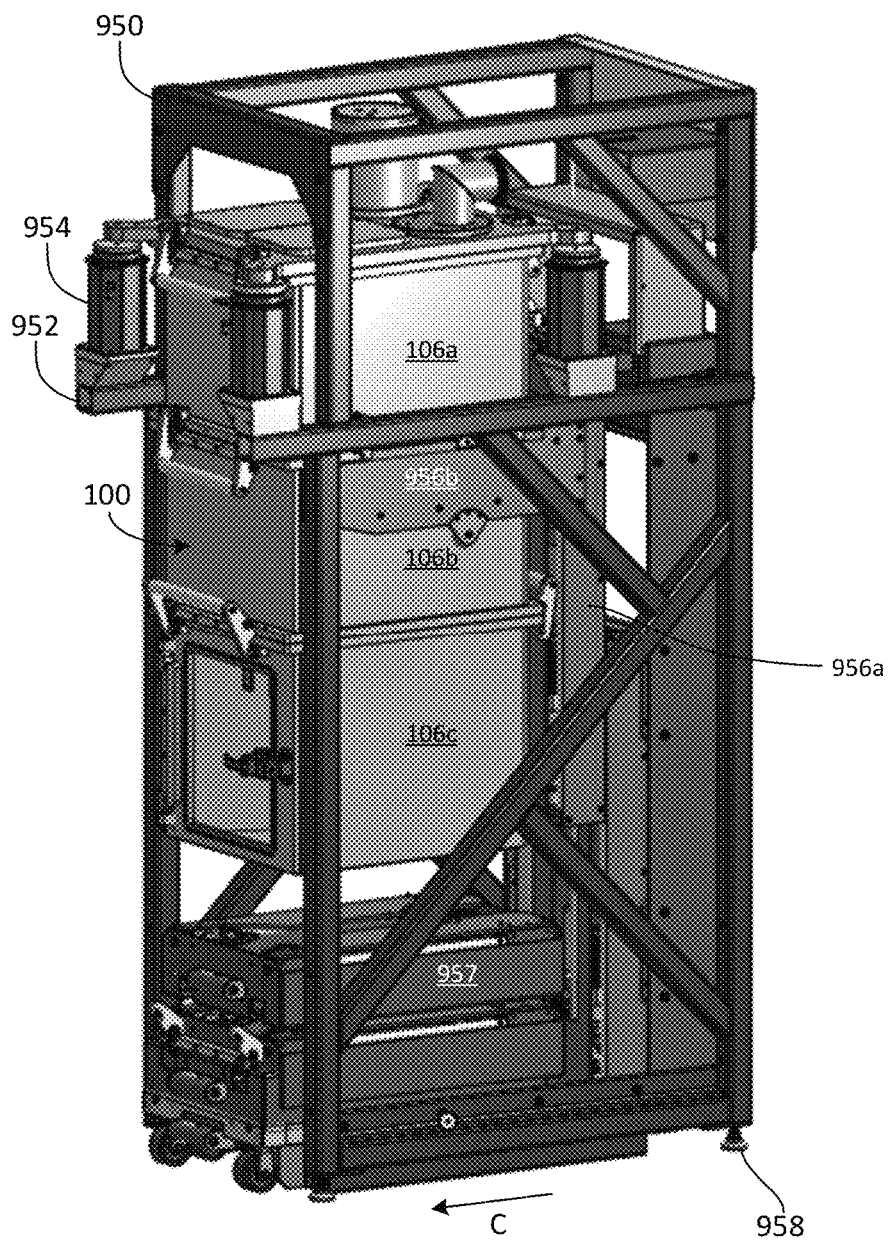
FIG. 9 is a side view of an illustrative external support rack and integrated lift configured to raise and lower portions of the vacuum chamber, in accordance with some embodiments described herein.

FIG. 9 is a side view of an illustrative external support rack 950, in accordance with some embodiments described herein. In some embodiments, the external support rack 950 may support the dilution refrigerator 100 by suspending the dilution refrigerator 100 off of the floor below the dilution refrigerator 100. As shown in the example of FIG. 9, the external support rack 950 may include arms 952 that are coupled to portions of the top surface of the vacuum chamber 106 by vibration isolation components 954 to suspend the dilution refrigerator 100 off of the floor. In some embodiments, the vibration isolation components 954 may be air pistons, electromagnetic dampeners, and/or springs.

In some embodiments, the external support rack 950 may include castors (not shown) configured to assist in transportation of the dilution refrigerator 100. The castors may be retractable such that the wheels of the castors are not in contact with the floor supporting the external support rack 950 when the dilution refrigerator 100 is not being transported and/or is in operation.

In some embodiments, the external support rack 950 further includes floor supports 958. Floor supports 958 may be configured to extend from the external support rack 950 when the dilution refrigerator 100 is not being transported. Floor supports 958 may extend from the external support rack 950, for example, by the use of screws. The floor supports 958 may be used to lift and/or level the external support rack 950 away from the floor and/or to lift the castors of the external support rack 950 off of the floor. In some embodiments, the floor supports 958 may be used to correct the positioning of the external support rack 950 in the case of an uneven floor surface.

In some embodiments, the external support rack 950 may support additional components external to the outer vacuum chamber 106 of dilution refrigerator 100. For example, the external support rack 950 may house compressors, pumps, and/or cooling equipment configured to support the operation of the dilution refrigerator 100. Alternatively, these external components may be housed in an adjacent (e.g., a different) server rack-type container and/or support rack 950 than the dilution refrigerator 100, in some embodiments.

In some embodiments, the external support rack 950 may include elements configured to provide tool-free assembly and/or disassembly of the vacuum chamber 106 and access to the experimental volume, in accordance with some embodiments described herein. As shown in the example of FIG. 9, the vacuum chamber 106 includes three sections, a first section 106a, a second section 106b suspended from the first section 106a, and a third section 106c suspended from the second section 106b. It should be appreciated that the technology described herein is not limited to three sections, and that a vacuum chamber may have one, two, four, five, or six sections in some embodiments.

In some embodiments, the vacuum chamber 106 may have one or more substantially planar surfaces. In some embodiments, at least one of the one or more substantially planar surfaces may be disposed within a plane perpendicular to a plane of a floor supporting the dilution refrigerator. As shown in the example of FIG. 9, the sections 106a-106c may each have at least four substantially planar surfaces such that, when assembled, the vacuum chamber 106 is arranged to form a rectangular prism. In some embodiments, the vacuum chamber 106 may include two substantially planar surfaces disposed within a plane parallel to the plane of the floor and arranged to close the rectangular prism formed by the surfaces of the sections 106a-106c. In some embodiments, and as described below, the vacuum chamber 106 may have an opening accessible by a door 1070 in at least one of the substantially planar surfaces.

In some embodiments, the three sections 106a-106c of the vacuum chamber 106 may be partially or fully removable in order to provide access to internal portions of the dilution refrigerator 100. For example, the three sections 106a-106c of the vacuum chamber 106 may comprise removable panels (e.g., side panels, panels attached to a frame, etc.), in some embodiments. The three sections 106a-106c may be configured to allow a user of the dilution refrigerator 100 to be able to remove the vacuum chamber 106 from the dilution refrigerator 100 without needed a large clearance above or below the dilution refrigerator 100 (e.g., without needing high ceilings or a pit underneath the dilution refrigerator 100).

In some embodiments, the external support rack 950 may include an integrated lift 956a configured to support the three sections 106a-106c of the vacuum chamber during assembly, disassembly, and/or maintenance of the dilution refrigerator 100. The integrated lift 956a may be configured to raise and/or lower the sections 106a-106c of the vacuum chamber. For example, the integrated lift 956a may be configured to raise and/or lower arms 956b configured to support portions (e.g., the flanges) of the three sections 106a-106c. In some embodiments, the integrated lift 956a may be operated manually (e.g., using screws and/or cables). In some embodiments, the integrated lift 956a may be operated using an electronically-operated machine (e.g., pneumatic or hydraulic devices).

In some embodiments, the external support rack 950 may include one or more carts 957. The carts 957 may be configured to receive one or more of the sections 106a-106c when lowered manually or by using the integrated lift 956a. For example, the integrated lift 956a may be used to lower the third section 106c onto a cart 957. Thereafter, the third section 106c may be transported using the cart 957 along direction C to provide a user of the dilution refrigerator 100 space under the interior components of the dilution refrigerator 100.

In some embodiments, the integrated lift 956a may be removably coupled to the external support rack 950. For example, the integrated lift 956a may be slidably removable from the external support rack 950 (e.g., sliding horizontally outward along the direction C). Removal of the integrated lift 956a may be desired to provide the user with extra space (e.g., during maintenance of the dilution refrigerator 100).

Figure 10B:
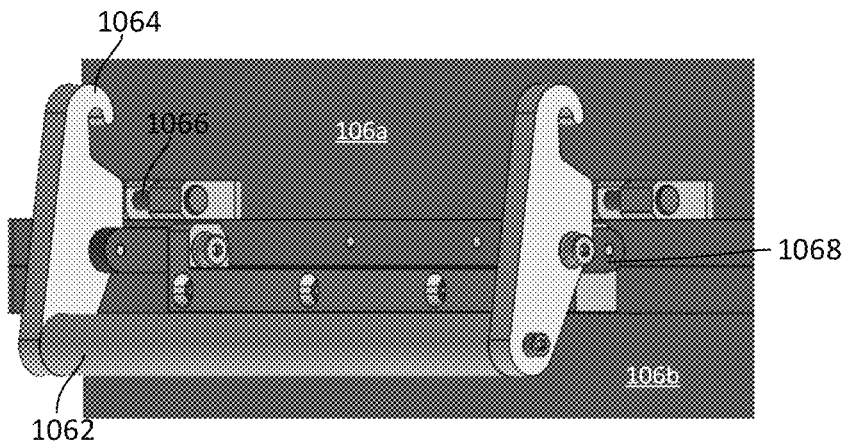
FIGS. 10B and 10C are views of integrated latches in open and closed positions, respectively, configured to provide tool-free assembly of the vacuum chamber, in accordance with some embodiments described herein.
Figure 10C:
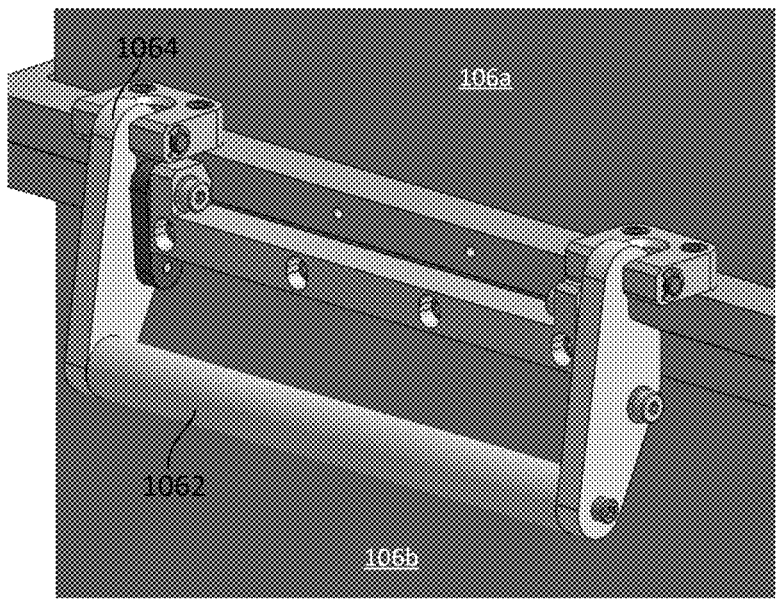

In some embodiments, the three sections 106a-106c of the vacuum chamber 106 may be suspended from one another by integrated clamps and/or cams. Such integrated clamps and/or cams may be configured to enable a user to unclamp or clamp two sections of the three sections 106a-106c together without the use of any additional tools. FIGS. 10A-10C illustrate an example of an integrated cam 1060, with FIG. 10B showing the integrated cam 1060 in an open position and FIG. 10C showing the integrated cam 1060 in a closed position.

In some embodiments, the integrated cam 1060 includes a handle 1062 that enables a user to clamp or unclamp two sections of the three sections 106a-106c together or apart. The handle 1062 is coupled to two latches 1064 that are configured to connect to bars 1066. The handle 1062 and latches 1064 are hingedly coupled to a section of the vacuum chamber 106 by cams 1068, which provide the requisite range of motion to perform clamping and unclamping motions.

In some embodiments, a compressive layer may be included at the connection points between the three sections 106a-106c of the vacuum chamber 106 to ensure a proper vacuum-safe seal. For example, a rubber O-ring, copper or indium gasket, or other vacuum-safe compressive layer may be placed between sections 106a-106c.

Returning to FIG. 10A, in some embodiments, the vacuum chamber 106 may include an external opening to provide access to an internal volume within the dilution refrigerator 100. For example, the opening may provide access to a sample stage or experimental volume of the dilution refrigerator 100, or any other interior portion of the dilution refrigerator 100. In some embodiments, the opening may be sealed by a hermetic seal. In some embodiments, the opening may be sealed by a door 1070, as shown in the example of FIG. 10A. The door 1070 may be sealed, for example, using a hinge and/or a clamp that may be manually engaged and disengaged. In some embodiments, the door 1070 may be coupled to the opening by a load lock.

In some embodiments, the door 1070 may provide access through all of the inner radiation shields (not shown, and which may be thermally coupled to one or more of the thermal stages 108a-108f) of the dilution refrigerator 100 to allow a user to access the experimental volume. For example, a portion of the inner radiation shields (not shown) may be coupled to the door 1070 such that when a user opens the door 1070, the inner radiation shields slide or otherwise move to provide the user access with the interior portion of the dilution refrigerator. In some embodiments, a portion the inner radiation shields may be removable through the door 1070 and/or slidable through the door 1070.

In some embodiments, the external support rack 950 may be configured to be integrated with a server rack-type container. For example, the external support rack 950 may be configured to integrate the dilution refrigerator 100 with commercial server rack infrastructure (e.g., server racks). In some embodiments, the external support rack 950 may be configured to integrate the dilution refrigerator 100 with 19-inch server racks.

Figure 11:
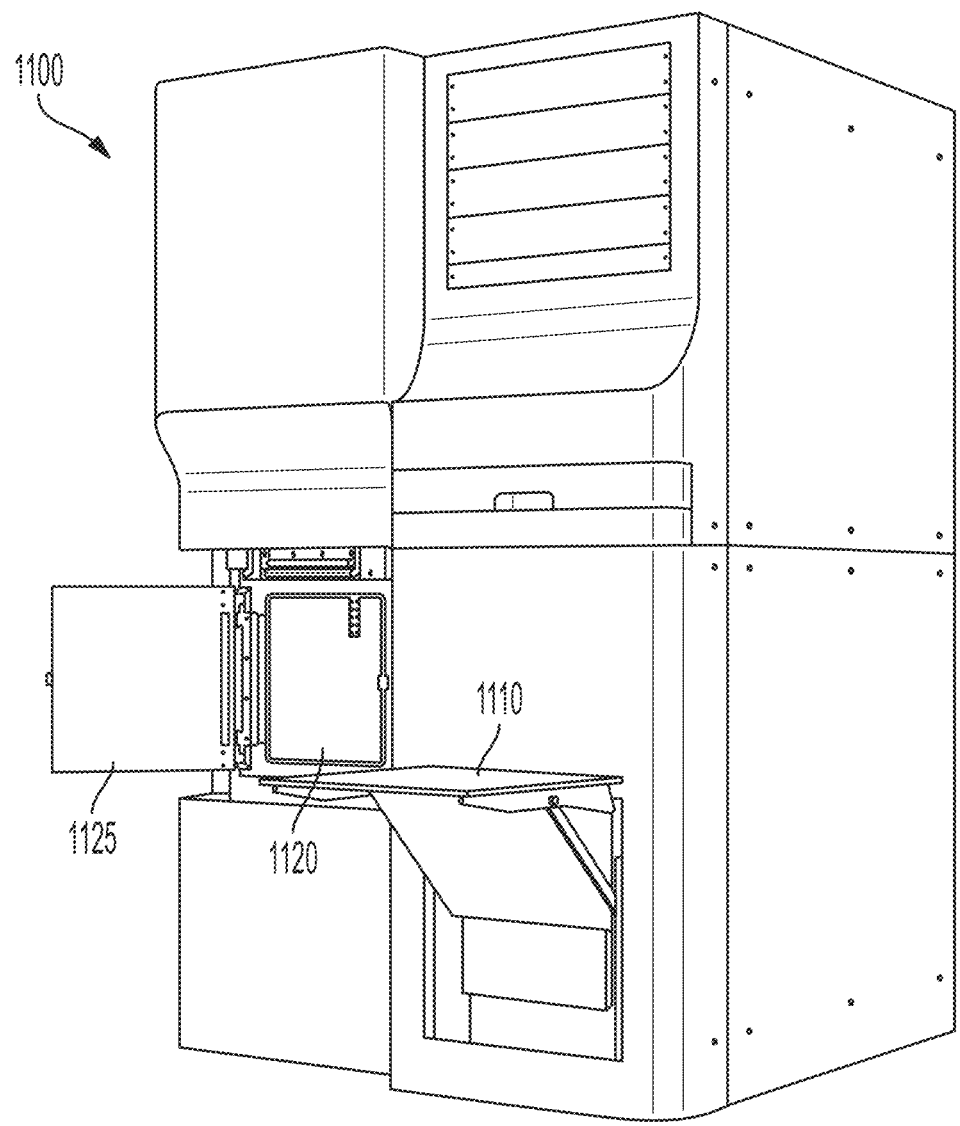
FIG. 11 is an exterior view of a housing configured to support a dilution refrigerator, in accordance with some embodiments described herein.

In some embodiments, the external support rack 950 and dilution refrigerator 100 may be housed within an outer housing. An example of an outer housing 1100 is illustrated in FIG. 11. In some embodiments, the outer housing 1100 may include an integrated horizontal surface 1110. For example, the integrated horizontal surface 1110 may be used as a desk or support surface when the user interacts with the dilution refrigerator. The integrated horizontal surface 1110 may be configured to be stowed by folding (as shown in the example of FIG. 11) or sliding away when not in use. In some embodiments, the outer housing 1100 may further include one or more storage locations (e.g., drawers, shelves) for the storage of related parts and/or tools for maintenance of the dilution refrigerator 100.

In some embodiments, the outer housing 1100 may further include a door 1125 providing access through an opening 1120 to the experimental volume of the dilution refrigerator 100. For example, the door 1125 may open to provide access to the experimental volume through the vacuum chamber 106 and the radiation shields inside of the vacuum chamber 106. In some embodiments, the vacuum chamber exterior and/or the radiation shields may be coupled to the door 1125 such that when a user opens the door 1125, the user opens the vacuum chamber exterior 106 and/or the radiation shields. In some embodiments, the radiation shields may alternatively be slidably and/or hingedly movable such that the user may move the radiation shields such that they no longer block access to the experimental volume as needed.

In some embodiments, the housing 1100 may further be configured to perform sound dampening. For example, the housing 1100 may include sound dampening materials to perform passive sound dampening. Alternatively or additionally, the housing 1100 may include audio equipment (e.g., speakers) configured to provide active sound dampening through the emission of destructive interference of the sounds generated by functional components of the system.

IV. Inverted Dilution Refrigerator

Conventionally, dilution refrigerators are oriented such that warmer thermal stages are positioned towards the top of the system with the thermal stages getting increasingly colder as the $^3$He/$^4$He mixture progresses to the bottom of the dilution refrigerator. The inventors have recognized and appreciated that an inverted geometry, with the coldest stage disposed at the top of the system (e.g., furthest from the floor) may simplify the operation and use of a dilution refrigerator by making the experimental volume more accessible to a user and offer improved thermodynamic qualities compared to a conventional dilution refrigerator. Accordingly, the inventors have developed an inverted, dry dilution refrigerator.

Figure 12A:
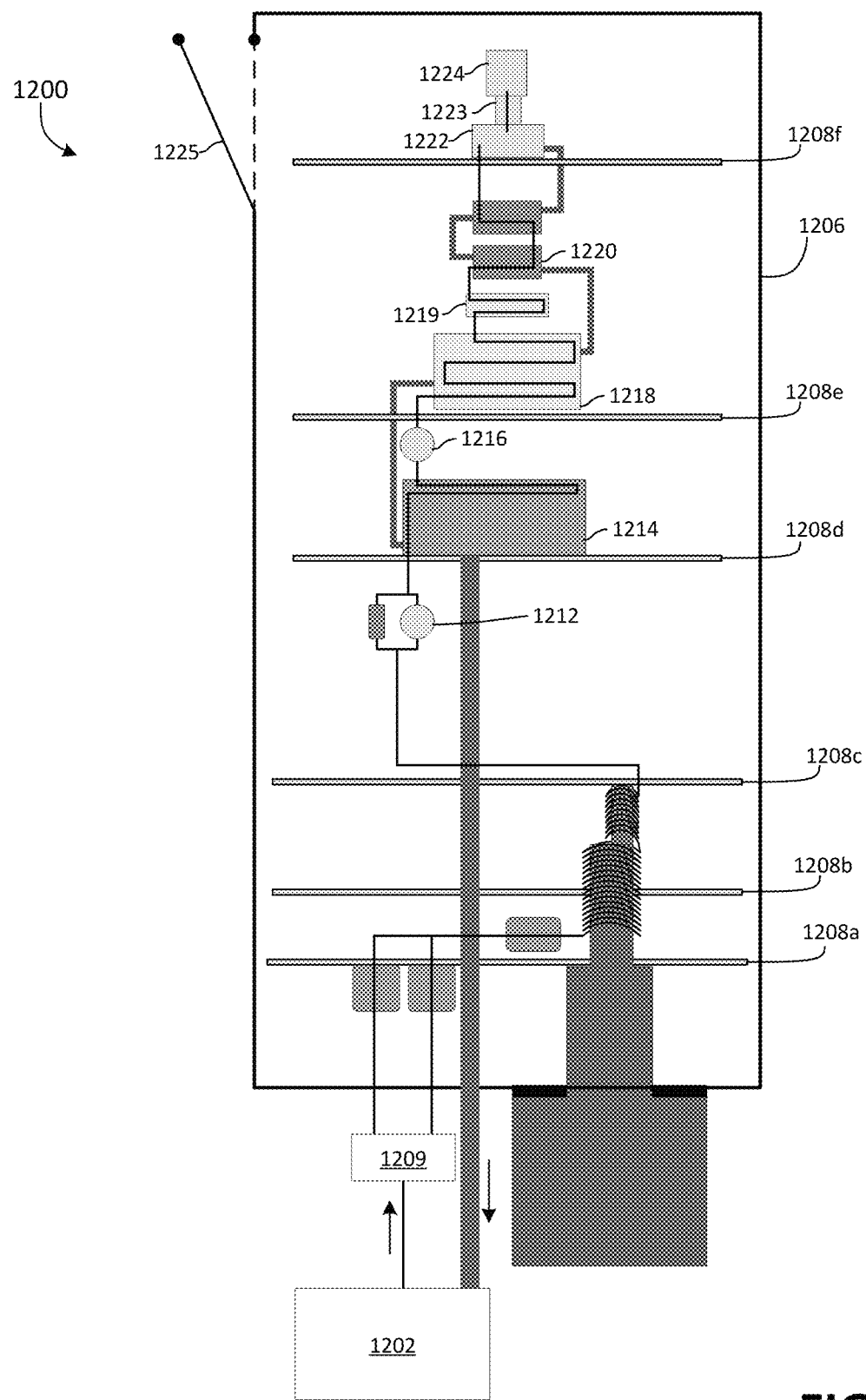
FIG. 12A is a schematic diagram of an inverted dilution refrigerator, in accordance with some embodiments described herein.

FIG. 12A is a schematic diagram of an inverted dilution refrigerator 1200, in accordance with some embodiments described herein. The inverted dilution refrigerator 1200 may include a pump system 1202 configured to circulate the $^3$He/$^4$He mixture through the dilution refrigerator 1200. The inverted dilution refrigerator 1200 also may include a cryocooler 1204. The cryocooler may be coupled to a cryocooler support (not pictured) as described in connection with cryocooler support 103 herein.

In some embodiments, the inverted dilution refrigerator 1200 may include an outer vacuum chamber 1206 and a series of thermal stages 1208a-1208f disposed inside of the outer vacuum chamber 1206. The series of thermal stages 1208a-1208f may be held at same or similar temperatures as the thermal stages 108a-108f described in connection with FIG. 1 herein.

In some embodiments, the inverted dilution refrigerator 1200 may include an opening in the outer vacuum chamber 1206 and/or through the inner radiation shields to provide ease of access to the coldest stage of the inverted dilution refrigerator 1200. In some embodiments, the opening may comprise hermetic seals and/or an opening mechanism 1225 that may withstand the vacuum within the outer vacuum chamber when the inverted dilution refrigerator 1200 is in operation. For example, the opening mechanism 1225 may include a hinged door and/or a removable panel.

In some embodiments, the inverted dilution refrigerator 1200 may include a number of components arranged along the length of the dilution refrigerator (e.g., from within the vacuum chamber 1206 to within the sixth thermal stage 1208f). The components may be arranged with the coldest thermal stage, the mixing chamber 1224, disposed above warmer thermal stages (e.g., the still 1214, impedance stages 1212 and 1216, heat exchangers 1218, 1219, 1220, etc.).

In some embodiments, the inverted dilution refrigerator 1200 includes a de-mixing chamber 1222 coupled to the mixing chamber 1224. In some embodiments, the de-mixing chamber 1222 may be thermally coupled to the mixing chamber 1224 by a heat exchanger 1223 (e.g., a co-flow heat exchanger). The de-mixing chamber 1222 may be fluidly connected to the mixing chamber 1224 such that $^3$He may be transported from the de-mixing chamber 1222 to the mixing chamber 1224 to provide additional cooling to the mixing chamber 1224. The de-mixing chamber 1222 may additionally have $^4$He injected into the de-mixing chamber 1222 to provide a co-flow of $^3$He and $^4$He in order to mitigate a concentration gradient forming between the still 1214 and the mixing chamber 1224.

Figure 12B:
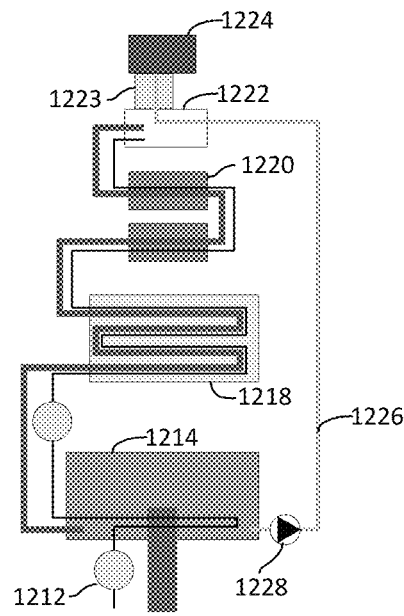
FIGS. 12B and 12C are schematic diagrams of illustrative components of an inverted dilution refrigerator, in accordance with some embodiments described herein.
Figure 12C:
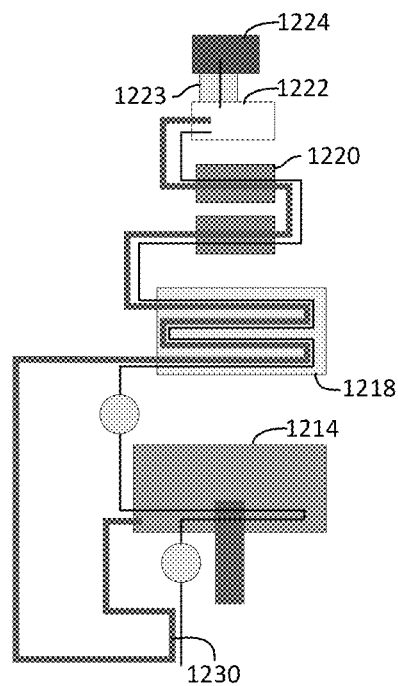

FIGS. 12B and 12C are schematic diagrams of exemplary internal components of an inverted dilution refrigerator, in accordance with some embodiments described herein. It should be appreciated that the exemplary components of FIGS. 12B and 12C could be implemented within inverted dilution refrigerator 1200 of FIG. 12A (e.g., within the third thermal stage 1208c).

As shown in the example of FIG. 12B, in some embodiments the inverted dilution refrigerator may include a $^4$He line 1226 configured to transport $^4$He from the still 1214 to the de-mixing chamber 1222. In some embodiments, the $^4$He line 1226 may include a pump 1228 configured to assist in the transportation of the $^4$He to the de-mixing chamber 1222. The pump 1228 may be, for example, a fountain pump in some embodiments. Alternatively or additionally, the $^4$He line 1226 may include additional heat exchangers to cool the $^4$He as it travels to the de-mixing chamber 1222.

As shown in the example of FIG. 12C, in some embodiments, the inverted dilution refrigerator may include a heat exchange stage 1230 configured to cool the incoming $^3$He/$^4$He mixture prior to the primary impedance stage 1212. As should be appreciated from the description of FIG. 1, such a configuration may increase the efficiency of the first impedance stage and/or eliminate or reduce the need for pressurization of the incoming $^3$He/$^4$He mixture.

V. Distributed Cooling

Dilution refrigerators generally include an integrated cryocooler (e.g., such as a pulse tube or a Gifford-McMahon cryocooler) to pre-cool the $^3$He/$^4$He mixture gas below 5 K. Conventionally, a dilution refrigerator is paired with at least one of these cryocoolers, and dilution refrigerators do not share cooling systems. Such small-scale dilution refrigeration systems typically rely on low-power cryocooling systems that are relatively inefficient (e.g., requiring more power for each Watt of cooling power at 4 K) in comparison to larger, higher-power cryocooling systems. The inventors have recognized and appreciated that a single, high-efficiency cooling system may be thermally coupled to multiple cryogenic systems such as dilution refrigerators to distribute this first stage of cooling across multiple cryogenic systems. Such distributed cooling therefore allows for increased cooling efficiency across multiple cryogenic systems.

Figure 13:
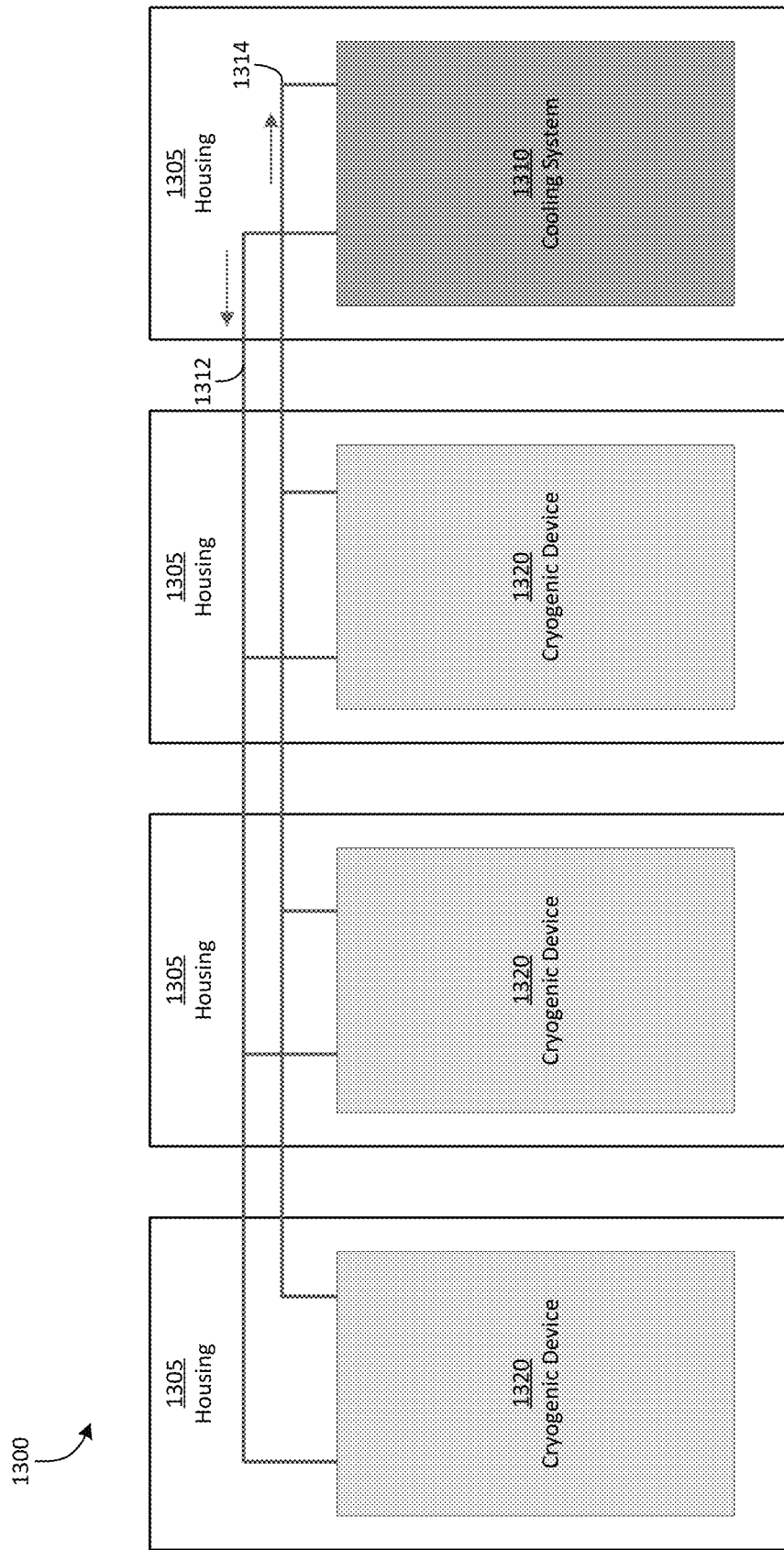
FIG. 13 is a schematic diagram of a distributed cooling system, in accordance with some embodiments described herein.

FIG. 13 is a schematic diagram of a distributed cooling system 1300, in accordance with some embodiments described herein. The distributed cooling system 1300 may include multiple housings 1305. In some embodiments, the housings 1305 may be server rack-type containers (e.g., commercial server rack infrastructure, 19-inch server racks).

As shown in the example of FIG. 13, each housing 1305 may contain a cooling system 1310 or a cryogenic device 1320. It should be appreciated that cryogenic devices 1320 and/or cooling systems 1310 may be grouped within housings 1305, in some embodiments. It should further be appreciated that while FIG. 13 shows three cryogenic devices 1320 coupled to the cooling system 1310, in some embodiments, there may be two, four, ten, or many tens of cryogenic devices 1320 coupled to the cooling system 1310, as aspects of this disclosure are not so limited.

In some embodiments, the cooling system 1310 may be a cryocooling system configured to cool a first stage of the cryogenic devices 1320 to a temperature of at least 5 K and/or to a temperature of approximately 4-5 K. In some embodiments, the cooling system 1310 may be a pulse tube. For example, the cooling system 1310 may be a pulse tube, a helium liquefier system, and/or a Brayton cryocooler.

In some embodiments, the cooling system 1310 may be thermally coupled to multiple cryogenic devices 1320. Cooling may be distributed to cryogenic devices 1320 from cooling system 1310 by cooling line 1312. Additionally, heat may be returned from the cryogenic devices 1320 to cooling system by return 1314. The cooling line 1312 and/or return 1314 may be lines configured to transfer liquid and/or gaseous helium. For example, the cooling line 1312 and/or return 1314 may be pipes that are vacuum insulated to maintain the temperature of the transported helium. In some embodiments, the cooling line 1312 and/or return 1314 may be fill lines, heat pipes (e.g., traditional and/or pulsed heat pipes), and/or a superfluid loop.

In some embodiments, the cryogenic devices 1320 may include any suitable refrigeration system configured to reach temperatures at or below 5 K. In some embodiments, cryogenic devices 1320 may include one or more dilution refrigerators (e.g., dilution refrigerator 100 as described herein, configured to reach temperatures below 1 K). Alternatively or additionally, it should be appreciated that cryogenic devices 1320 may include cryogenic systems other than dilution refrigerators (e.g., microscopy systems such as scanning tunneling microscopy or atomic force microscopy systems, $^3$He refrigeration systems, superconducting CMOS systems, etc.).

Figure 14:
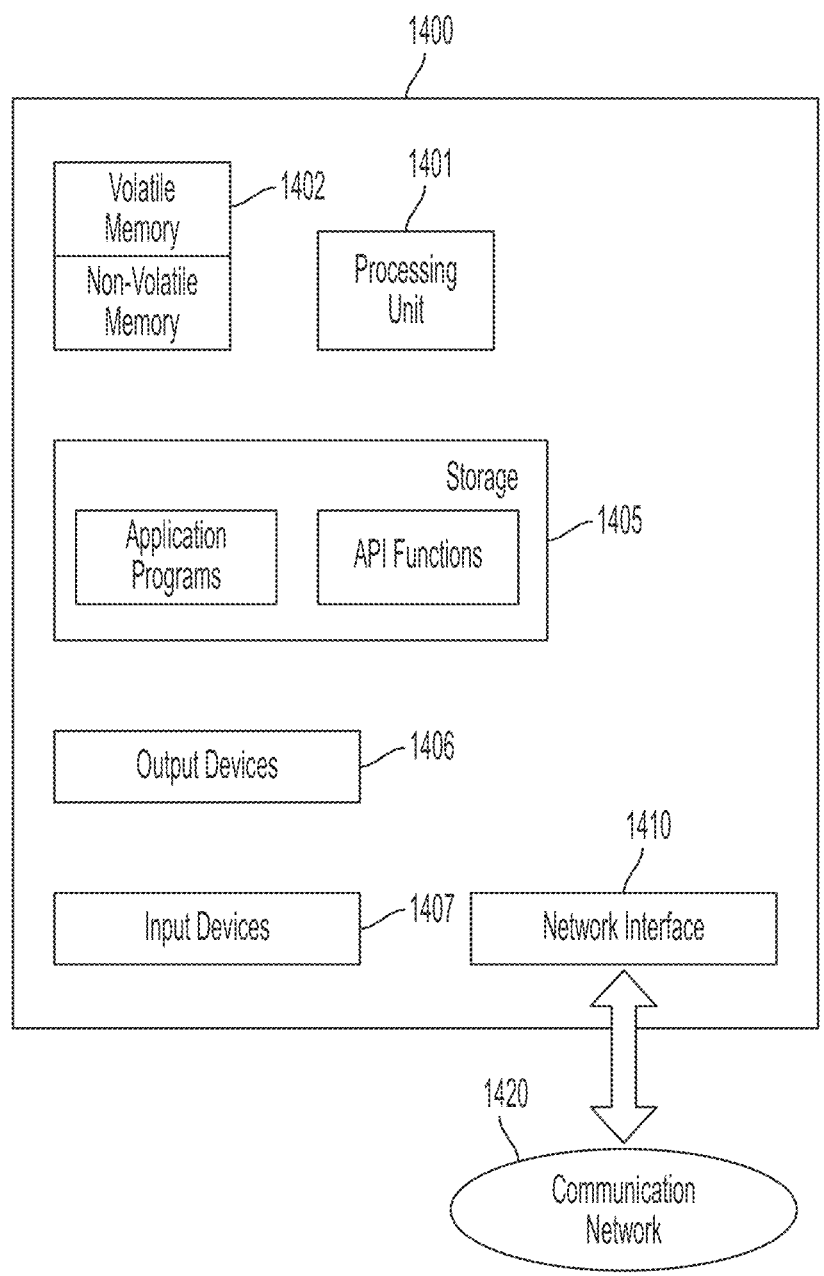
FIG. 14 depicts, schematically, an illustrative computing device on which aspects of the technology described herein may be implemented.

In the embodiment shown in FIG. 14, the computer 1400 includes a processing unit 1401 having one or more processors and a non-transitory computer-readable storage medium 1402 that may include, for example, volatile and/or non-volatile memory. The memory 1402 may store one or more instructions to program the processing unit 1401 to perform any of the functions described herein. The computer 1400 may also include other types of non-transitory computer-readable medium, such as storage 1405 (e.g., one or more disk drives) in addition to the system memory 1402. The storage 1405 may also store one or more application programs and/or resources used by application programs (e.g., software libraries), which may be loaded into the memory 1402.

The computer 1400 may have one or more input devices and/or output devices, such as devices 1406 and 1407 illustrated in FIG. 14. These devices can be used, among other things, to present a user interface. Examples of output devices that can be used to provide a user interface include printers or display screens for visual presentation of output and speakers or other sound generating devices for audible presentation of output.

Examples of input devices that can be used for a user interface include keyboards and pointing devices, such as mice, touch pads, and digitizing tablets. As another example, the input devices 1407 may include a microphone for capturing audio signals, and the output devices 1406 may include a display screen for visually rendering, and/or a speaker for audibly rendering, recognized text.

As shown in FIG. 14, the computer 1400 may also comprise one or more network interfaces (e.g., the network interface 1410) to enable communication via various networks (e.g., the network 1420). Examples of networks include a local area network or a wide area network, such as an enterprise network or the Internet. Such networks may be based on any suitable technology and may operate according to any suitable protocol and may include wireless networks, wired networks or fiber optic networks. Such networks may include analog and/or digital networks.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately," "about," and "substantially" may be used to mean within ±20% of a target value in some embodiments, within ±10% of a target value in some embodiments, within ±5% of a target value in some embodiments, within ±2% of a target value in some embodiments. The terms "approximately," "about," and "substantially" may include the target value.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

What is claimed is:

1. A dilution refrigerator comprising:
   a plurality of thermalization plates configured to be cooled to a plurality of temperatures, wherein:
      a first thermalization plate of the plurality of thermalization plates comprises an integrated heat exchanger,
      the integrated heat exchanger comprises channels formed in the first thermalization plate,
      the channels are configured to allow helium to flow through the first thermalization plate during operation of the dilution refrigerator, and
      the first thermalization plate further comprises a detachable portion, the detachable portion comprising the integrated heat exchanger; and
   an interchangeable dilution insert detachably coupled to the detachable portion of the first thermalization plate, wherein the dilution insert is detachably coupled to:
      a condensing line of the dilution refrigerator; and
      three thermalization plates of the plurality of thermalization plates.

2. The dilution refrigerator of claim 1, wherein the integrated heat exchanger is formed by additive manufacturing.

3. The dilution refrigerator of claim 1, wherein the dilution insert comprises a still configured to perform cooling by distilling $^3$He vapor from a mixture of $^3$He and $^4$He.

4. The dilution refrigerator of claim 1, further comprising:
   an experimental volume thermally coupled to a coldest thermalization plate of the plurality of thermalization plates;
   a still coupled to a second thermalization plate warmer than the coldest thermalization plate, the still being configured to perform cooling by distilling $^3$He vapor from a mixture of $^3$He and $^4$He; and
   a continuous heat exchanger disposed between the second thermalization plate and the coldest thermalization plate.

5. The dilution refrigerator of claim 1, further comprising at least one heat exchanger thermally coupled to a thermalization plate of the plurality of thermalization plates, wherein the at least one heat exchanger comprises a nanomaterial.

6. The dilution refrigerator of claim 5, wherein the nanomaterial comprises at least one or nanowires, nanofoams, nanopellets, and/or nanotubes.

7. The dilution refrigerator of claim 5, wherein the nanomaterial comprises nanowires comprising one or more of copper nanowires, silver nanowires, gold nanowires, platinum nanowires, polymer nanowires, carbon nanowires, and/or carbon fiber nanowires.

8. The dilution refrigerator of claim 5, wherein the at least one heat exchanger comprises one of a discrete heat exchanger and/or a heat exchanger disposed in a mixing chamber of the dilution refrigerator.

9. The dilution refrigerator of claim 1, further comprising:
   the condensing line, being configured to transport helium to a coldest thermalization plate of the plurality of thermalization plates;
   a still disposed along the condensing line before the coldest thermalization plate;
   a heat exchanger disposed along the condensing line between the still and the coldest thermalization plate; and
   a heat exchange line configured to transfer a return helium mixture from the heat exchanger to the still and to decrease a temperature of a helium mixture in the condensing line at a location above the still.

10. The dilution refrigerator of claim 9, further comprising a Joule-Thomson expander disposed along the condensing line before the still, wherein:
   the heat exchange line is configured to decrease the temperature of the helium mixture in the condensing line at a location before the Joule-Thomson expander.

11. The dilution refrigerator of claim 1, further comprising:
   the condensing line, being configured to transport helium to a coldest thermalization plate of the plurality of thermalization plates; and
   a high-surface area material disposed along the condensing line and configured to cause the transported helium to adsorb to the high-surface area material during a cooldown cycle of the dilution refrigerator.

12. The dilution refrigerator of claim 11, wherein:
   a first end of the high-surface area material is switchably thermally coupled to a warmer thermalization plate of the plurality of thermalization plates by a first heat switch, and
   a second end opposite the first end of the high-surface area material is switchably thermally coupled to a colder thermalization plate of the plurality of thermalization plates by a second heat switch.

13. The dilution refrigerator of claim 11, further comprising at least one heater thermally coupled to the high-surface area material and configured to cause, by heating the high-surface area material, the adsorbed helium to release from the high-surface area material and to be cooled by moving between a warmer thermalization plate of the plurality of thermalization plates to a colder thermalization plate of the plurality of thermalization plates.

14. The dilution refrigerator of claim 13, further comprising:
   a first valve disposed along the condensing line between the warmer thermalization plate and the high-surface area material; and
   a second valve disposed along the condensing line between the high-surface area material and the colder thermalization plate, wherein:
      the first valve and the second valve are configured to, when the first valve is closed and the second valve is opened, cause helium adsorbed onto the high-surface area material to be transported from the warmer thermalization plate to the colder thermalization plate.

15. The dilution refrigerator of claim 11, wherein the high-surface area material comprises one of activated charcoal or a metal powder.

16. The dilution refrigerator of claim 1, further comprising:
- a condensing line configured to transport helium from a helium inlet to a coldest thermalization plate of the plurality of thermalization plates;
- a first helium filter disposed along the condensing line;
- a second helium filter disposed in parallel with the first helium filter along the condensing line; and
- at least one valve configured to switch a flow of helium along the condensing line between the first helium filter and the second helium filter.

17. The dilution refrigerator of claim 16, wherein the first helium filter and/or the second helium filter comprises a charcoal trap.

18. The dilution refrigerator of claim 16, further comprising:
- a first counterflow heat exchanger disposed between the first helium filter and the helium inlet; and
- a second counterflow heat exchanger disposed between the second helium filter and the helium inlet.

19. The dilution refrigerator of claim 1, further comprising:
- the condensing line, being configured to transport helium to a coldest thermalization plate of the plurality of thermalization plates;
- a Joule-Thomson expander disposed along the condensing line; and
- a bypass disposed in parallel with the Joule-Thomson expander along the condensing line, the bypass configured to allow the transported helium to bypass the Joule-Thomson expander when the transported helium has a temperature above a threshold value and below 300 K.

20. The dilution refrigerator of claim 19, wherein the bypass comprises a material configured to allow the transported helium to diffuse through the material when the transported helium has a temperature above the threshold value and below 300 K.

21. The dilution refrigerator of claim 20, wherein the material comprises a polymer.

* * * * *